US006603332B2

(12) United States Patent
Kaviani et al.

(10) Patent No.: US 6,603,332 B2
(45) Date of Patent: Aug. 5, 2003

(54) CONFIGURABLE LOGIC BLOCK FOR PLD WITH LOGIC GATE FOR COMBINING OUTPUT WITH ANOTHER CONFIGURABLE LOGIC BLOCK

(75) Inventors: Alireza S. Kaviani, San Jose, CA (US); Sundararajarao Mohan, Sunnyvale, CA (US); Ralph D. Wittig, Menlo Park, CA (US); Steven P. Young, Boulder, CO (US); Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/008,556

(22) Filed: Nov. 9, 2001

(65) Prior Publication Data

US 2002/0079921 A1 Jun. 27, 2002

Related U.S. Application Data

(63) Continuation-in-part of application No. 09/861,261, filed on May 18, 2001, now Pat. No. 6,400,180, which is a continuation-in-part of application No. 09/591,762, filed on Jun. 12, 2000, now Pat. No. 6,288,569, which is a continuation-in-part of application No. 09/258,024, filed on Feb. 25, 1999, now Pat. No. 6,150,838.

(51) Int. Cl.[7] .............................................. H03K 19/177
(52) U.S. Cl. .............................. 326/39; 326/38; 326/41
(58) Field of Search ...................................... 826/37–41

(56) References Cited

U.S. PATENT DOCUMENTS

| RE34,363 E | 8/1993 | Freeman |
| 5,267,187 A | 11/1993 | Hsieh et al. |
| 5,349,250 A | 9/1994 | New |
| 5,357,153 A | 10/1994 | Chiang et al. |
| 5,362,999 A | 11/1994 | Chiang |
| 5,365,125 A | 11/1994 | Goetting et al. |
| 5,386,156 A * | 1/1995 | Britton et al. ............... 326/37 |
| 5,668,771 A | 9/1997 | Cliff et al. |
| 5,828,229 A | 10/1998 | Cliff et al. |
| 5,889,411 A | 3/1999 | Chaudhary |
| 6,020,759 A | 2/2000 | Heile |
| 6,043,676 A * | 3/2000 | Mendel et al. ............... 326/39 |
| 6,118,300 A * | 9/2000 | Wittig et al. ................. 326/41 |
| 6,201,410 B1 | 3/2001 | New et al. |

OTHER PUBLICATIONS

U.S. patent application Ser. No. 09/574,534, Bauer et al., filed May 19, 2000.
"The Programmable Logic Data Book 1996"; available from Xilinx, Inc., 2100 Logic Drive, San Jose, CA 95124; pp. 4–32 to 4–37.
Xilinx Advance Product Specification DS031 (v1.1)"Virtex–II 1.5V Field–Programmable Gate Arrays" Dec. 6, 2000 pp. 46–55.
"Virtex–II Platform FPGA Handbook"; 2001; available from Xilinx, Inc. 2100 Logic Drive, San Jose, CA 95124.
"The Programmable Logic Data Book 1999"; available from Xilinx, Inc., 2100 Logic Drive, San Jose, CA 95124; pp. 3–7 to 3–9.

\* cited by examiner

Primary Examiner—Michael Tokar
Assistant Examiner—Anh Q. Tran

(57) ABSTRACT

An apparatus for implementing fast sum-of-products logic in an FPGA is disclosed. The apparatus includes a CLB including a plurality of slices and a second-level logic circuit to combine the outputs of the slices. Typically, the second-level logic circuit is an OR gate or its equivalent that implements the sum portion of the sum-of-products expression. Alternatively, a combining gate may be included within the slice to combine the output of one slice with the output of another slice. In this case the combing gates of each of the slices are connected in series to sum the result of the product operation of a given slice with the product operations from preceding slices. The slice may also include a dedicated function generator to increase the performance of each slice to implement wide functions, particularly sum-of-products functions. The dedicated function generator may include an AND gate and an OR gate with a multiplexer as a selector.

16 Claims, 29 Drawing Sheets

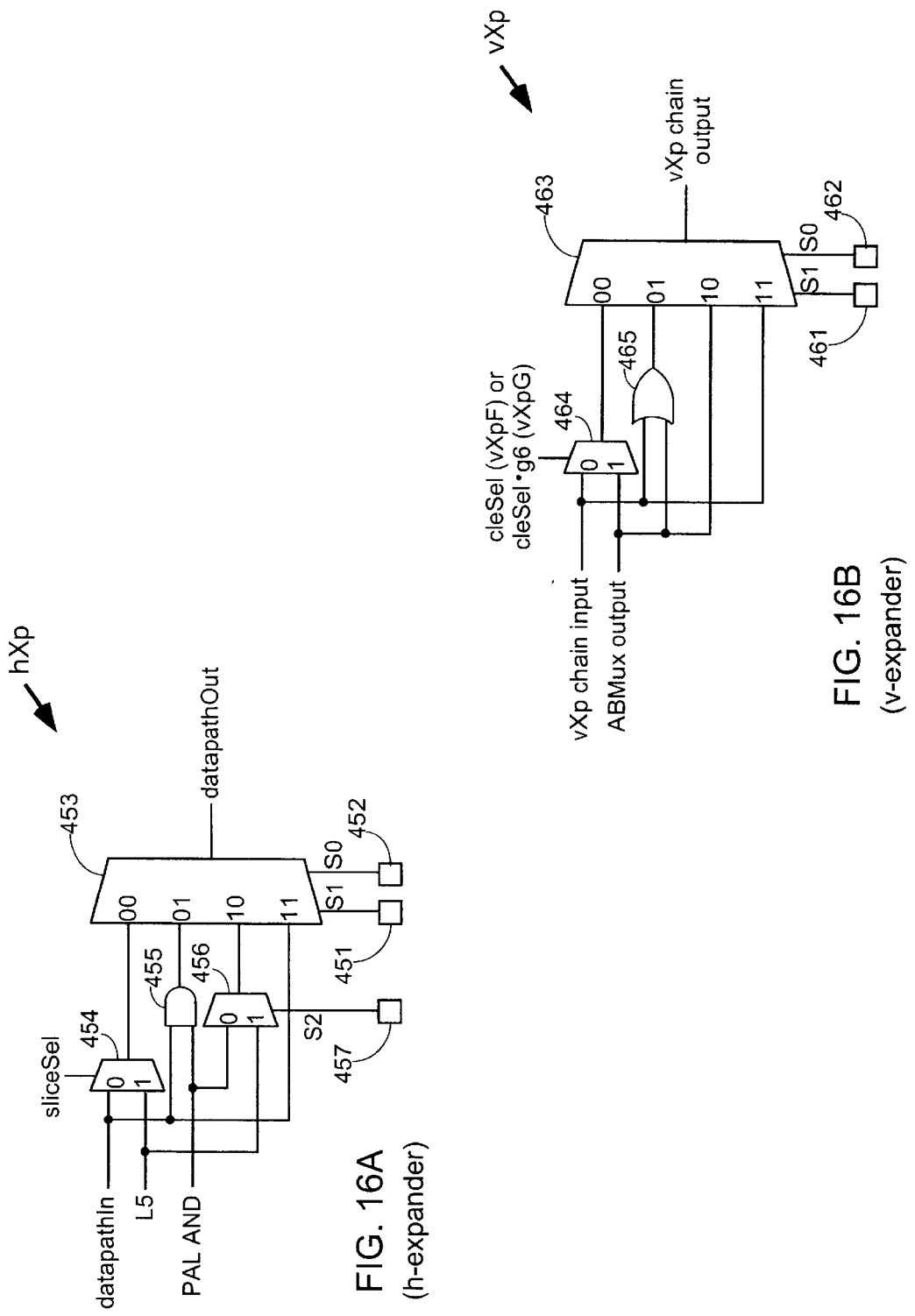

(AB expander)

(SOP expander)

(4 Pterms with 16 inputs, or 2 PALs of 2 Pterms with 16 inputs)

(4 Pterms with 32 inputs)

FIG. 21 (1 PAL of 4 Pterms with (m*16) inputs)

(1 PAL of 4(r*c) Pterms with (m*16) inputs)

CONFIGURABLE LOGIC BLOCK FOR PLD WITH LOGIC GATE FOR COMBINING OUTPUT WITH ANOTHER CONFIGURABLE LOGIC BLOCK

PRIORITY INFORMATION

This patent application is a continuation-in-part of U.S. patent application Ser. No. 09/861,261 filed May 18, 2001, and issued Jun. 4, 2002 as U.S. Pat. No. 6,400,180, which is a continuation-in-part of U.S. patent application Ser. No. 09/591,762 filed Jun. 12, 2000 and issued Sep. 11, 2001 as U.S. Pat. No. 6,288,569 B1, which claims priority to U.S. patent application Ser. No. 09/258,024 filed Feb. 25, 1999 and issued Nov. 21, 2000 as U.S. Pat. No. 6,150,838.

BACKGROUND

This invention relates to programmable integrated circuit devices. More specifically, the present invention relates to field programmable gate arrays (FPGAs).

An FPGA is a type of programmable logic device (PLD) that can be configured to perform various logic functions. An FPGA includes an array of configurable logic blocks (CLBs) connectable via programmable interconnect structures. For example, a first FPGA, invented by Freeman, is described in U.S. Pat. No. RE34,363. CLBs and interconnect structures in FPGAs are shown in U.S. Pat. No. 5,889,411 issued to Chaudhary et al. and pages 4–32 through 4–37 of the Xilinx 1996 Data Book entitled "The Programmable Logic Data Book" available from Xilinx, Inc., 2100 Logic Drive, San Jose, Calif. 95124. The Freeman reference, the Chaudhary reference, and the Data Book are incorporated herein by reference.

In addition to the structures discussed above, FPGAs also include structures for performing special functions. In particular, FPGAs include carry circuits and lines for connecting the carry output of one bit generated in one CLB to the carry input of another CLB, and cascade lines for allowing wide functions to be generated by combining several adjacent CLBs. Carry structures are discussed by Hsieh et al. in U.S. Pat. No. 5,267,187 and by New in U.S. Pat. No. 5,349,250.

Cascade structures are discussed by Goetting et al in U.S. Pat. No. 5,365,125 and Chiang et al. in U.S. Pat. No. 5,357,153. These patents are also incorporated herein by reference. Structures for multiplexing lookup table outputs to form very wide functions are discussed by Bauer and Young in U.S. Pat. No. 6,323,682 (application Ser. No. 09/574,534) also incorporated herein by reference.

As discussed by the above-incorporated references, each CLB may include one or more slices ("slice" or "CLB slice"). Each slice, in turn, includes at least one configurable function generator. The configurable function generator is typically implemented as a four-input lookup table (LUT). The incorporated references also point out that the carry circuits and cascade structures increase the speed at which the FPGA can perform certain functions, such as arithmetic functions.

FIG. 1A is a simplified block diagram of a conventional CLB 100. The illustrated CLB 100 includes a first slice 110 and a second slice 120. First slice 110 includes a first function generator G 112, a second function generator F 114, a third function generator 116, and an output control block 118. Output control block 118 may include multiplexers, flip-flops, or both. Four independent input terminals are provided to each of the G and F function generators 112 and 114. A single input terminal C1-in is provided to third function generator C1 116. Each of function generators 112 and 114 is typically implemented as a four-input LUT, and is capable of implementing any arbitrarily defined Boolean function of the inputs signals. Each of the input terminals may be assigned a number or a letter and referred to as a "literal." For example, in CLB 100, function generator 112 receives four input signals, or literals, G1, G2, G3, and G4. Function generator 116, typically implemented as a set of configurable multiplexers, is often used to handle carry bits, but can implement some Boolean functions of its three input signals C1-in, G', and F'. These Boolean functions include bypass, inverter, 2-input AND (product), and 2-input OR (sum). Signals G', F', and C1-out are multiplexed through output control block 118. Output control block 118 provides output signal lines Y, QY, X, and QX. Slice 110 may also provide the carry out signal, C1-out. Second slice 120 is similar to first slice 110. The carry out signal from second slice 120, C2-out, is the carry-in signal C1-in of first slice 110.

Operation of CLB 100 is also described by the incorporated references, and, in particular, in chapters seven and eight of the above-incorporated Data Book. For simplicity, CLB 100 of FIG. 1 is illustrated with two slices; however, the number of slices constituting a CLB is not limited to two.

FIG. 1B is a simplified block diagram of another conventional CLB 100a. CLB 100a is similar to CLB 100 of FIG. 1A but has an additional LUT 113. LUT 113 takes outputs of LUT 112 and 114 as well as another input K1 to slice 110a. Thus, LUT 113 allows slice 110a to implement any arbitrarily defined Boolean function of nine literals G1, G2, G3, G4, F1, F2, F3, F4, and K1. CLB 110a may include additional slices represented by ellipses 120a.

Technology mapping for LUT-based FPGAs involves decomposition of a circuit into combinational logic having nodes with 4-input ("fan-in") functions that can be realized in the LUTs of CLB slices. This is because, as shown in slice 110, the slices commonly include 4-input LUTs as their function generators. By conventionally specifying the functions of function generators F, G, and Cl, and output control block 118, slice 110 can be programmed to implement various functions including, without limitation, two independent functions of up to four variables each.

Circuit designs are mapped to FPGAs as combinational and sequential logic. The combinational logic may be expressed in Boolean expressions including a number of logic levels and routing between the logic levels. The Boolean expressions include product (logical AND) and sum (logical OR) operations. Two levels of combinational logic may be expressed using sum-of-products (SOP) format. In fact, given a set of inputs and their inverse, any logic equation can be expressed using the SOP format.

In the FPGA art, there is a continuing challenge to increase speed (performance) of FPGA-implemented functions, or circuits. Circuit performance, or speed, is increased when circuit delay is decreased. Circuit delay includes two main components: logic delay and routing delay.

Using logical axioms and Boolean algebraic rules, it is possible to partially collapse a circuit design to reduce the number of logic levels, thus reducing the routing delay. However, this creates wide fan-in nodes. In FPGAs having four-input LUTs, wide fan-in nodes require use of several levels of LUTs for implementation. Therefore, to implement wide fan-in nodes, multiple levels of CLBs must be used. The requirement to use multiple levels of CLBs increases the logic delay as well as creating other routing delays. These negative effects cancel out the benefits from the routing delay reduction provided by the partial collapse of the circuit design.

Accordingly, there is a need for a method to implement wide fan-in nodes in FPGAs while avoiding the negative effects described above. Additionally, there is a need for CLB and CLB slice designs that allow for fast implementation of wide fan-in SOP functions.

SUMMARY

According to one aspect of the invention, a CLB has two or more slices, each slice having an output. The CLB also includes a second-level circuit for combining the outputs from the slices.

According to another aspect of the invention, a CLB has at least one slice. The slice has at least two configurable function generators receiving a plurality of inputs and generating, together, a first output. The slice also includes a combining gate for combining the first output with a combining gate input to generate a combining gate output wherein the combining gate input is an input to the first CLB slice and wherein the combining gate output is an output of the first CLB slice.

According to a further aspect of the invention, a CLB has at least one slice. The slice has a first configurable function generator generating a first output, a second configurable function generator generating a second output, and a dedicated function generator for receiving the first output and the second output to generate a dedicated output. The dedicated function generator includes a first logic gate with an output, a second logic gate with an output, and a multiplexer allowing selection between the two logic gate outputs.

According to yet another aspect of the invention, a CLB has two or more slices. Each of the slices has a first configurable function generator generating a first output, a second configurable function generator generating a second output, and a dedicated function generator for receiving the first output and the second output to generate a dedicated output. The dedicated function generator includes a first logic gate and a second logic gate. The CLB also has a second-level circuit for combining the dedicated outputs from its slices.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 16A shows one embodiment of a horizontal expander that can be used with the slice of FIG. 14.

FIG. 16B shows one embodiment of a vertical expander that can be used with the slice of FIG. 14.

FIG. 19 shows how the two VIMs of one slice can generate four output signals, each comprising one Pterm (i.e., product term) of 16 inputs.

FIG. 20 shows how horizontally adjacent VIMs (i.e., VIMs in two different slices) can be combined using expanders to generate four output signals, each comprising one Pterm of 32 inputs.

FIG. 21 shows how two or more slices can be combined using expanders to generate one OR'ed output signal comprising four Pterms of m*16 inputs (i.e., m times 16 inputs), where m is the number of slices.

FIG. 22 shows how multiple VIMs can be combined using expanders to implement PALs with more than 8 Pterms of more than 16 inputs.

DETAILED DESCRIPTION

Figure 1A:
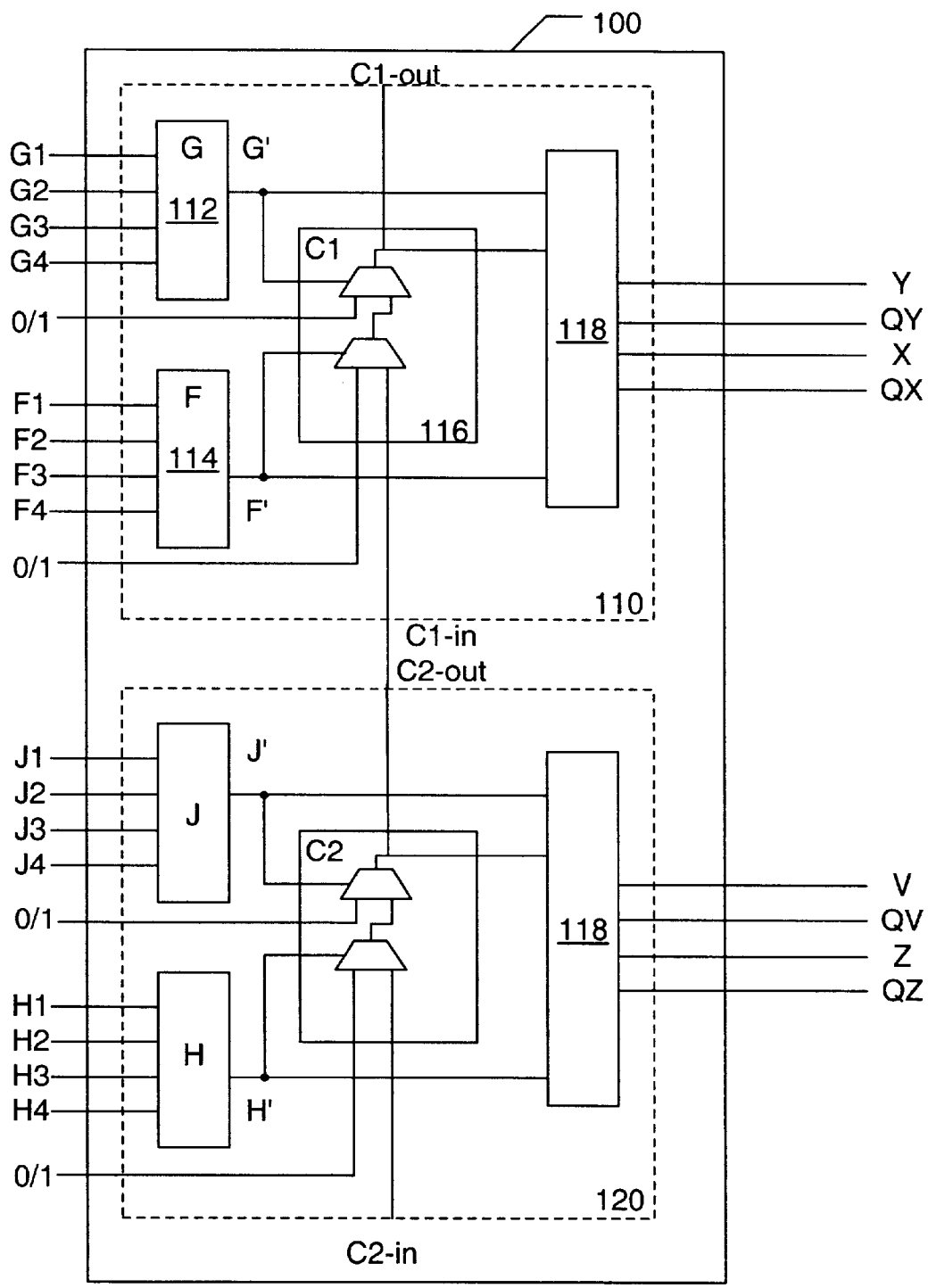
FIG. 1A illustrates a conventional configurable logic block (CLB)

As shown in the drawings, the invention is embodied in a method of decomposing wide-fan-in combinational logic circuit designs for implementation using configurable logic block (CLB) slices having low-fan-in LUTs. The decomposition technique is based on the fact that similar input patterns of the combinational logic may be shared among slices to reduce the number of LUTs required to implement the combinational logic. After the decomposition, the combinational logic can be implemented using fewer slices. Reducing the required number of slices improves area efficiency, and the resulting reduction in signal propagation delay improves speed performance.

CLBs in accordance with one embodiment of the invention are adapted to include dedicated logic to combine the outputs of CLB slices. The dedicated logic, which may be a "second-level logic circuit" in one embodiment, replaces look-up-table logic conventionally used to combine slice outputs when implementing wide fan-in functions. Reducing the need for look-up-table logic improves speed performance and reduces the number of slices required to implement many SOP expressions. In another embodiment, slices include the combining gate. In this case, the combining gate of a first slice may be serially connected to the combining gate of a second slice. Still other embodiments include slices with dedicated function generators in each slice. The dedicated function generators efficiently combine the outputs of respective first and second function generators.

P3=(~3.~4.5.D.~E);

P4=(~3.~4.5.~E.~F);

P5=(~2.~3.~4.5.8.9.~E);

P6=(~3.~4.5.8.A.~B.~E); and

P7=(~3.~4.5.6.7.8.9.~E).

Equation EQ.1 can be expressed as a personality matrix, as shown below in TABLE 1. The columns of the personality matrix are associated with the inputs of a given function, each column corresponding to an input signal or line. The rows P1 through P7 of the personality matrix correspond to the product terms ("Pterms") of the circuit expressed as a sum-of-products. In the example of Table 1, Pterm P1 produces a logic one output if lines 1, 3, 4, and E express logic zeros and line 5 expresses a logic one. The remaining inputs lines, designated as "–" for Pterm P1, are "don't care" bits, and do not affect the result. The Pterm results for each Pterm P1–P7 are summed (i.e., AND'ed) to generate an output result of the combinational logic circuit. Therefore, the number of inputs, or variables, in the SOP expression equals the number of columns, and the number of Pterms equals the number of rows of the corresponding personality matrix.

TABLE 1

(PERSONALITY MATRIX OF EQ. 1)

| Pterms | Input Lines | | | | | | | | | | | | | | | Pterm Result |
|---|---|---|---|---|---|---|---|---|---|---|---|---|---|---|---|---|
| | 1 | 2 | 3 | 4 | 5 | 6 | 7 | 8 | 9 | A | B | C | D | E | F | |
| P1 | 0 | — | 0 | 0 | 1 | — | — | — | — | — | — | — | — | 0 | — | 1 |
| P2 | — | — | 0 | 0 | 1 | — | — | — | — | — | — | 0 | — | 0 | — | 1 |
| P3 | — | — | 0 | 0 | 1 | — | — | — | — | — | — | — | 0 | 0 | — | 1 |
| P4 | — | — | 0 | 0 | 1 | — | — | — | — | — | — | — | — | 0 | 0 | 1 |
| P5 | — | 1 | 0 | 0 | 1 | — | — | 1 | 1 | — | — | — | — | 0 | — | 1 |
| P6 | — | — | 0 | 0 | 1 | — | — | 1 | — | 1 | 0 | — | — | 0 | — | 1 |
| P7 | — | — | 0 | 0 | 1 | 1 | 1 | 1 | 1 | — | — | — | — | 0 | — | 1 |

Section 1: Literal-Sharing Decomposition

For purposes of explaining the literal-sharing decomposition technique of the present invention, a sample combinational logic circuit having fifteen input signals and one output signal is used. The sample combinational logic circuit may be described using a Boolean expression shown as EQ.1 below where the fifteen input signals are represented by numbers 1 through F, each having one of two Boolean values 0 or 1. EQ.1 below expresses the sample combinational logic circuit in SOP format using conventional logic symbols including "+" for the OR operation, "." for the AND operation, and "~" for the NOT operation. For convenience, the Pterms are referred to as P1, P2, . . . P7. Pterms P1, P2, P3, and P4 have five literals each, Pterms P5 and P6 have seven literals each, and Pterm P7 has eight literals.

$$EQ. 1 = (\sim 1. \sim 3. \sim 4.5 \sim E) + (\sim 3. \sim 4.5 \sim C. \sim E) +$$

$$(\sim 3. \sim 4.5 \sim D. \sim E) + (\sim 3. \sim 4.5 \sim E. \sim F) +$$

$$(2. \sim 3. \sim 4.5.8.9. \sim E) + (\sim 3. \sim 4.5.8.A. \sim B. \sim E) +$$

$$(\sim 3. \sim 4.5.6.7.8.9. \sim E)$$

$$= P1 + P2 + P3 + P4 + P4 + P5 + P6 + P7$$

where

P1=(~1.~3.~4.5.~E);

P2=(~3.~4.5.~C.~E);

The personality matrix for the sample circuit expressed by equation EQ.1 is relatively sparse. That is, the number of literals of the personality matrix is relatively low compared to the total number of input signals. Experimental results show that sparse personality matrices are common for combinational logic circuits.

To implement EQ.1 under the current art, each of the Pterms must be implemented in its own CLB slice. This is because each Pterm has five to eight input signals, or fan-ins. In addition, the sum operation (to sum the Pterm results) must be implemented within another slice, bringing the total number of the required slices to eight. Thus, implementation of the above example would require four CLBs each having two slices or two CLBs each having four slices.

A decomposition technique in accordance with the invention reduces the number of slices required to implement the sample personality matrix by combining Pterms. This is possible because Pterms may share literals and patterns of literals. Sharing of literals allows Pterms to share slices, resulting in more efficient use of resources. In one embodiment, Pterms are summed if the resultant product chain can be implemented using the same number of slices as one of the summed Pterms. A "product chain" is a combination of Pterms that share one or more literals. A product chain would typically include at least two Pterms; however, a single Pterm may be designated as a product chain with which other Pterms may be combined. A Pterm or a product chain may be implemented on one or more CLB slices. A "slice chain" is one or more slices configured to implement a Pterm or a product chain.

Figure 2:
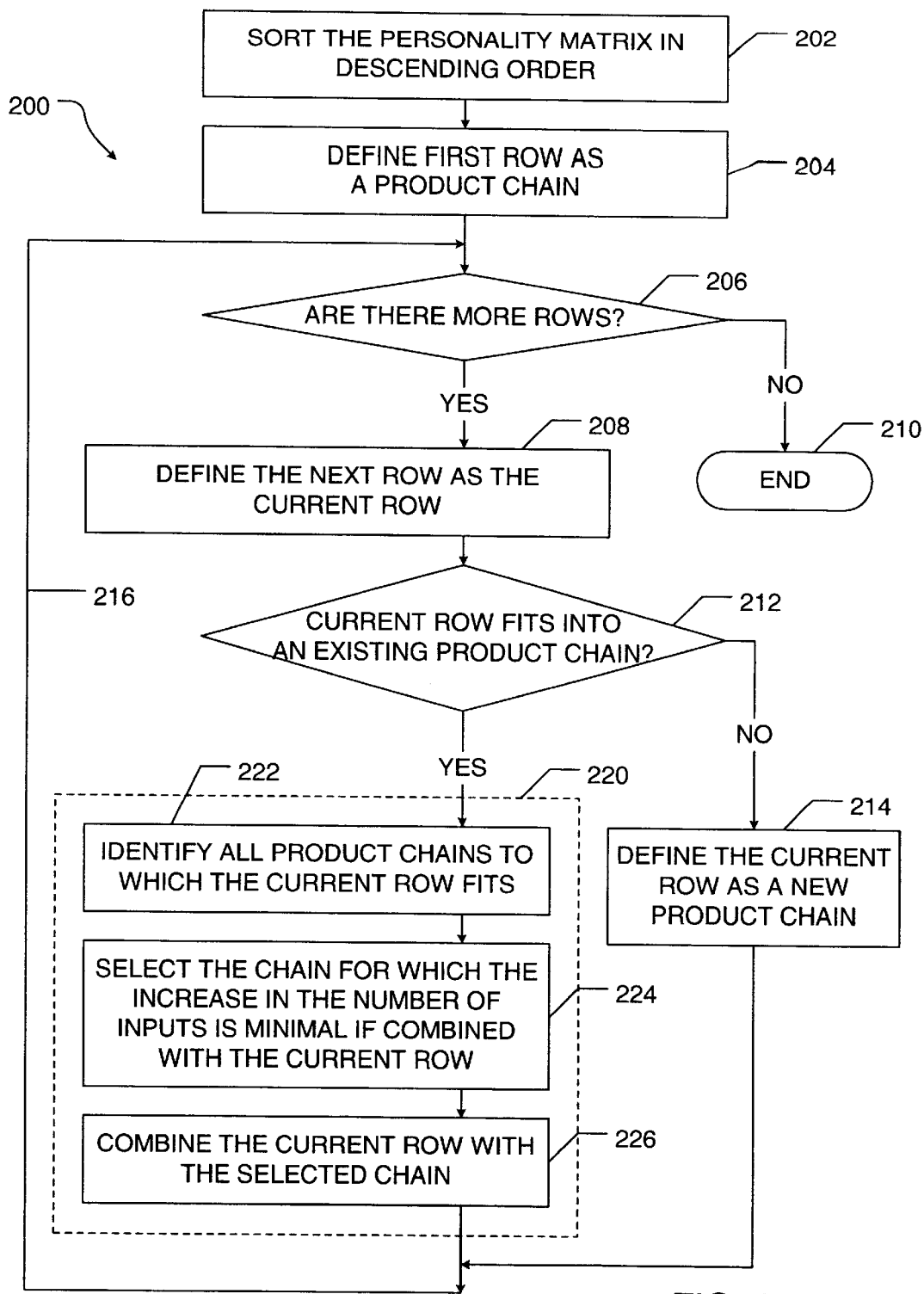
FIG. 2 is a flowchart illustrating a process of decomposing combination logic by sharing literals.

FIG. 2 is a flowchart 200 illustrating the process of decomposing a wide fan-in circuit design expressed in SOP format. Circuit designs expressible in SOP format are also expressible in Berkeley Logic Interchange Format (BLIF) using a "personality matrix." To share the literal patterns, first the personality matrix is sorted in descending order based on the number of literals present for each Pterm (operation 202) (The sorting process may not be required.) Then, the first Pterm is identified as a first product chain. The remaining Pterms are analyzed in the sorted order as discussed below.

TABLE 2 illustrates a result of the sorting operation performed on the expression of TABLE 1. Pterm P7 has the highest number of literals (eight), and therefore moves to the top of the personality matrix. The next two Pterms are Pterms P5 and P6, each having seven literals. Pterms P1, P2, P3, and P4 follow with five literals each.

Figure 3A:
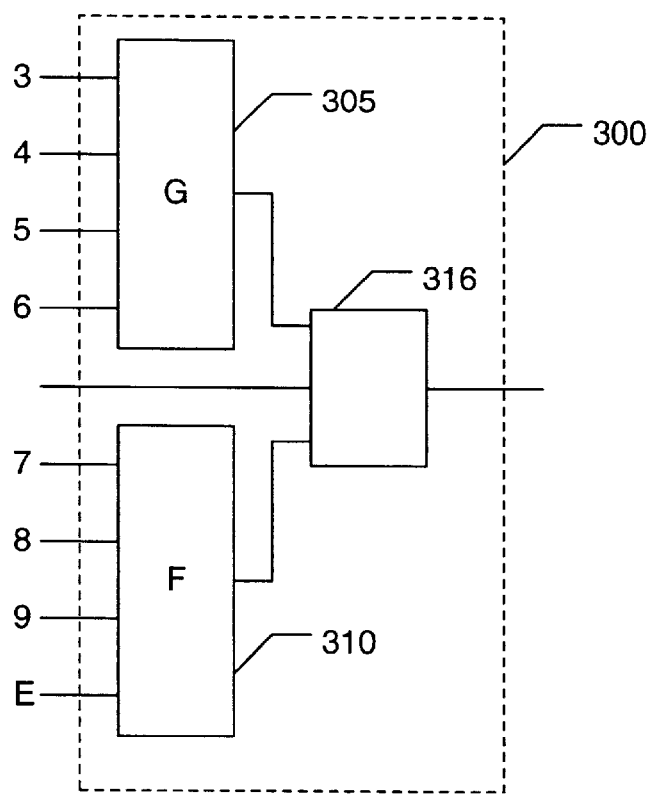
FIG. 3A illustrates a CLB slice configured to implement a sample product term.
Figure 3B:
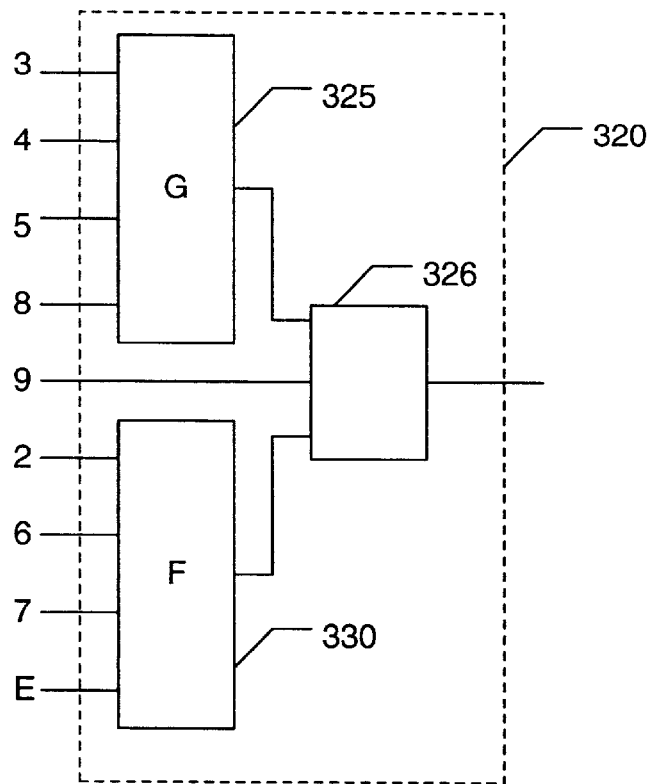
FIG. 3B illustrates a CLB slice configured to implement a sample product chain.

Here, Chain P7+P5 can be implemented on a single slice 300 as shown in FIG. 3B. Chain P7+P5 can be implemented on a single slice because Chain P7+P5 requires only nine literals. Even though Chain P7 requires eight literals and Pterm P5 requires seven literals, six literals are common between Chain P7 and Pterm P5, leaving only three non-shared literals. To share the literals, both the literals and the functions of the shared literals must be shared.

Pterms P7 and P5 share literals 3, 4, 5, 8, 9, and E. That is, both Pterms P7 and P5 use literals 3, 4, 5, 8, 9, and E in the same way to determine their respective results.

Referring to FIG. 3B, slice 320 implements chain P7+P5 by configuring a first LUT 325 to implement shared literals 3, 4, 5, and 8. A second LUT 330 is configured to implement non-shared literals 2, 6, and 7 as well as to implement one shared literal E. Non-shared literals are literals that are not common to the Pterms or product chains being compared.

TABLE 2

(SORTED PERSONALITY MATRIX)

| $n^{th}$ Row | Pterm | 1 | 2 | 3 | 4 | 5 | 6 | 7 | 8 | 9 | A | B | C | D | E | F | Result |
|---|---|---|---|---|---|---|---|---|---|---|---|---|---|---|---|---|---|
| 1 | P7 | — | — | 0 | 0 | 1 | 1 | 1 | 1 | 1 | — | — | — | — | 0 | — | 1 |
| 2 | P5 | — | 1 | 0 | 0 | 1 | — | — | 1 | 1 | — | — | — | — | 0 | — | 1 |
| 3 | P6 | — | — | 0 | 0 | 1 | — | — | 1 | — | 1 | 0 | — | — | 0 | — | 1 |
| 4 | P1 | 0 | — | 0 | 0 | 1 | — | — | — | — | — | — | — | — | 0 | — | 1 |
| 5 | P2 | — | — | 0 | 0 | 1 | — | — | — | — | — | — | 0 | — | 0 | — | 1 |
| 6 | P3 | — | — | 0 | 0 | 1 | — | — | — | — | — | — | — | 0 | 0 | — | 1 |
| 7 | P4 | — | — | 0 | 0 | 1 | — | — | — | — | — | — | — | — | 0 | 0 | 1 |

The first row, P7, is defined as a new product chain operation 204). Here, the product chain P7, "Chain P7," requires one slice having two four-input LUTs for implementation.

FIG. 3A illustrates a portion of a conventional slice 300 configured to implement the product expressed by Chain P7. Slice 300 includes a pair of four-input LUTs 305 and 310 and carry logic 316. The input terminals of LUTs 305 and 310 are connected to like-numbered input terminals identified in the matrices of Tables 1 and 2. Carry logic 316 is used as an AND gate having input terminals connected to the respective output terminals of LUTs 305 and 310.

LUTs 305 and 310 can be combined with carry logic 316 to perform logic functions of up to nine literals. Chain P7 has fewer than nine literals. Therefore, Chain P7 can be implemented in one slice. At this stage of the decomposition process, Chain P7 is the only existing product chain and consists of only one Pterm P7.

Next, each remaining row is examined (decisions and operations from 206 through 226 of FIG. 2) in turn, to determine whether the row being examined (the "current row") fits into any existing product chain (decision 212). Each remaining row is analyzed as follows:

The next row is defined as the current row for examination (operation 208). The current row is examined to determine whether the current row fits into any of the existing product chains (decision 212). The current row fits into a product chain if the combined product chain (the product chain+ the current row) can be implemented on the same number of slices as the product chain itself.

Returning to the example, at decision operation 212 of FIG. 2, the current row is Pterm P5 and the only existing product chain consists of Pterm P7. As shown in FIG. 3A, the Chain P7 can be implemented on a single slice 300. Pterm P5 fits Chain P7 if the combination of Chain P7 and Pterm P5 (hereinafter "Chain P7+P5") can be implemented on a single slice.

Finally, the remaining shared literal 9 is implemented using carry circuit 326. In order to combine a Pterm to a product chain, the number of non-shared literals between the Pterm and the product chain must be less than or equal to the number of inputs of a LUT. In the present example, this number is four.

In general, a row fits into a product chain if either of the following two criteria is met:

the carry circuit of a slice configured to implement the product chain is used as an OR gate; and the row can be added to one of the LUTs (that is, the composite number of literal inputs to the row and the LUT is less than or equal to 4); or the carry circuit of a slice configured to implement the product chain is used as an AND gate; and the number of non-shared literals between the product chain and the row is 4 or less.

Using these criteria, the relationship between Chain P7 and Pterm P5 may be examined in detail. After the operations 202 to 208 of FIG. 2, Chain P7 is the only product chain. Chain P7, having eight literals, may be implemented on a single slice having two LUTs, as depicted in FIG. 3A. Carry circuit 316 in this case must be an AND gate to perform the product function on the input lines. Because P7 only has eight literals, the ninth input, the carry input, is not used. Slice 310 also includes a programmable output control block; however, to avoid clutter, the output control block is not illustrated in the figure.

Referring again to FIG. 2 and continuing to refer to FIG. 3A, next, the second row, Pterm P5, becomes the current row (operation 208). To determine whether the current row fits Chain P7 (decision 212), the above-described two criteria are examined. In this case, because carry circuit 316 of Chain P7 is an AND gate, the criterion (1) is not met. The current row fits Chain P7 under the criterion (2) because carry circuit 316 of Chain P7 is an AND gate and the number of non-shared literals is only three.

Here, Chain P7 and Pterm P5 share literals 3, 4, 5, 8, 9, and E. Chain P7 and Pterm P5 do not share literals 2, 6, and 7. The relationship between Chain P7 and Pterm P5 may be expressed using the SOP format and logic symbols as:

$$\text{(Chain 7) OR (Pterm P5)} = (\sim 3. \sim 4.5.6.7.8.9. \sim E) + (2. \sim 3. \sim 4.5.8.9. \sim E)$$

factoring out the shared literals results in $$= (\sim 3. \sim 4.5.8.9. \sim E) \cdot ((6.7) + 2)$$
$$= \text{shared literals} \cdot (\text{sum of non-shared literals})$$

There are only three non-shared literals—2, 6, and 7. This fact, combined with the fact that carry circuit 316 of Chain P7 is an AND gate, satisfies criterion (2). Accordingly, P5 fits Chain P7 (operation 212).

If the current row fits at least one of the existing product chains, then the current row is combined into the product chain (operation 220). If there is no product chain to which the current row fits, then the current row becomes a new product chain (operation 214).

In this example, the current row, P5, fits Chain P7. In the next step, step 222, all product chains to which the current row fits are identified. Here, there is only one product chain, Chain P7. However, if multiple product chains are identified as fitting the current row of the Pterm, then the optimal product chain is selected by selecting the product chain for which increase in the number of inputs is minimal if combined with the current row (operation 224).

Following the selection of the product chain, the current row is combined into the selected product chain (operation 226). In this present example, Chain P7 and Pterm P5 are combined to create a new product chain, Chain P7+P5 (operation 226). TABLE 3 below shows Chain P7+P5. Note that, with nine input literals, implementation of Chain P7+P5 requires the use of the carry circuit.

As indicated by loop 216, the above-described process is repeated for each of the remaining rows. For example, the next current row is row 3, Pterm P6 (operation 208). Then, P6 is compared with Chain P7+P5 to determine the fit at operation 212. P6 does not fit Chain P7+P5 because P6 requires two more literals, A and B, and chain P7+P5 can not accommodate any more literals and still fit within the same number of slices. Accordingly, a new product chain, Chain P6 is defined (operation 214).

Next, the 4$^{th}$ row of the sorted matrix, Pterm P1, becomes the current row (operation 208). Then, P1 is compared with Chain P7+P5 and with Chain P6 to determine the fit at operation 212. P1 fits Chain P6 under criterion (2). Thus, P1 is combined with Chain P6 to generate Chain P6+P1 (operation 220).

These operations are repeated until no more rows are remaining in the sorted matrix. The process then terminates as indicated by terminator 210 of the flowchart 200.

Analysis of the sorted matrix TABLE 2 under the present technique results in the product chains listed in TABLE 4.

TABLE 4

(RESULTANT PRODUCT CHAINS)

| Chain | Input Lines | | | | | | | | | | | | | | |
|---|---|---|---|---|---|---|---|---|---|---|---|---|---|---|---|
| | 1 | 2 | 3 | 4 | 5 | 6 | 7 | 8 | 9 | A | B | C | D | E | F |
| P7 + P5 | — | 1 | 0 | 0 | 1 | 1 | 1 | 1 | 1 | — | — | — | — | 0 | — |
| P6 + P1 | 0 | — | 0 | 0 | 1 | — | — | 1 | — | 1 | 0 | — | — | 0 | — |
| P2 + P3 + P4 | — | — | 0 | 0 | 1 | — | — | — | — | — | — | 0 | 0 | 0 | 0 |

Figure 4A:
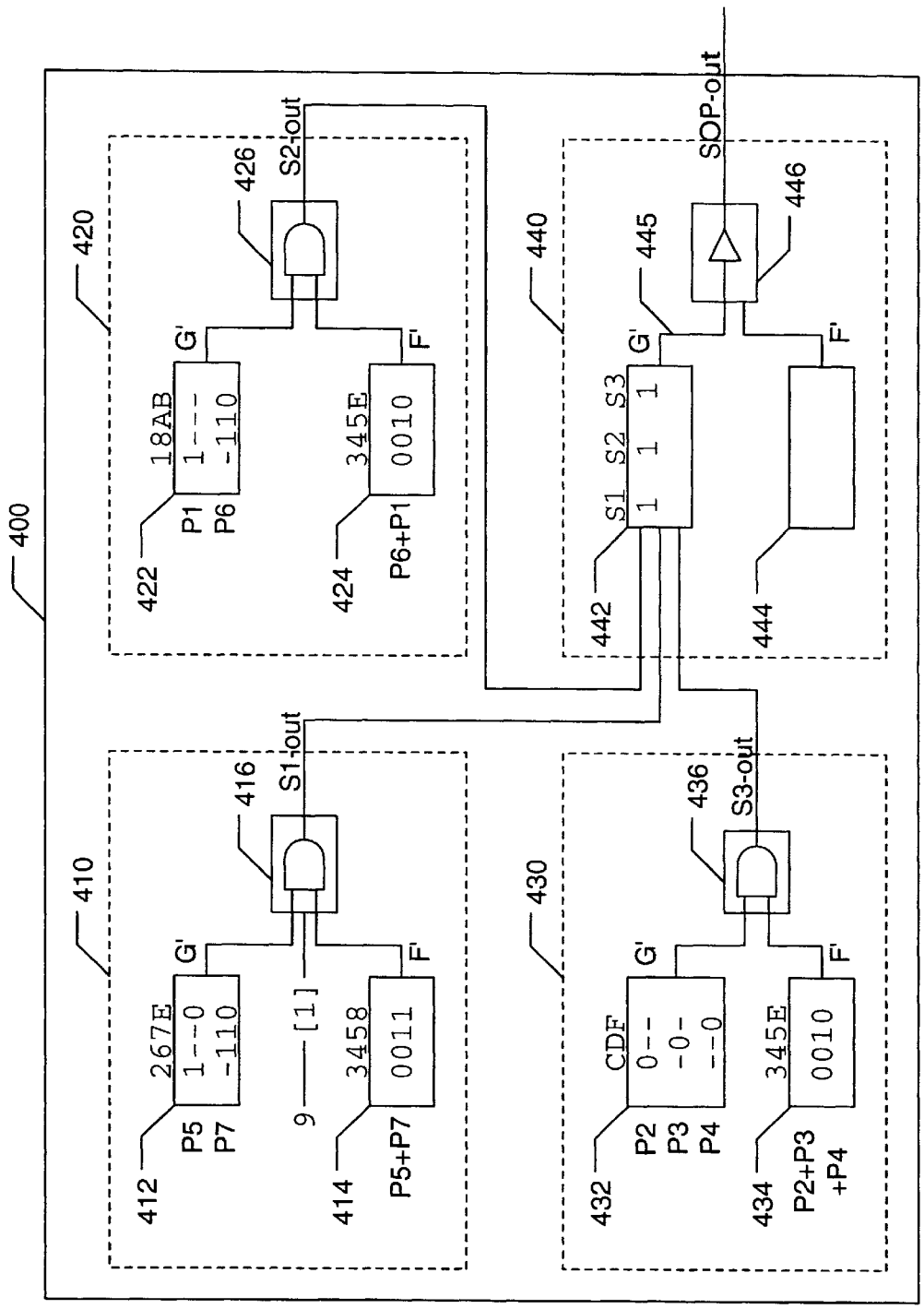
FIG. 4A illustrates a CLB implementation of a sample combinational logic circuit.

FIG. 4A illustrates a CLB 400 implementing the product chains listed in TABLE 4. CLB 400 includes four slices 410, 420, 430, and 440. First slice 410 is configured to implement Chain P7+P5. The non-shared literals—literals 2, 6, and 7—and one of the shared literals, E, are implemented using a LUT 412. The remaining five shared literals—literals 3, 4, 5, 8, and 9—are implemented using a combination of a LUT 414 and a carry circuit 416. First slice 410 generates a sum of the Pterms for P7 and P5 as its output, S1-out.

First and second configurable function generators 412 and 414 are commonly implemented using look-up-tables (LUTs). Third configurable function generator 416 is typically a set of multiplexers, flip-flops, or both, designed to handle carry bits but also configurable to perform as a bypass, an inverter, an AND gate, or an OR gate.

Second slice 420 is configured to implement Chain P6+P1. The non-shared literals—1, 8, A, and B—are implemented using LUT 422. The shared literals—3, 4, 5, and E—are implemented using LUT 424. Carry circuit 426 is used as an AND gate to generate a product of the outputs of LUTS 422 and 424. Second slice 420 generates a sum of the Pterms for P1 and P6 as its output, S2-out.

Third slice 430 is configured to implement Chain P2+P3+ P4. The non-shared literals—literals C, D, and F—are implemented using LUT 432. The shared literals—literals 3,

TABLE 3

(Chain P7 + P5)

| Chain | Input Lines | | | | | | | | | | | | | | |
|---|---|---|---|---|---|---|---|---|---|---|---|---|---|---|---|
| | 1 | 2 | 3 | 4 | 5 | 6 | 7 | 8 | 9 | A | B | C | D | E | F |
| P7 + P5 | — | 1 | 0 | 0 | 1 | 1 | 1 | 1 | 1 | — | — | — | — | 0 | — |

4, 5, and E—are implemented using LUT 434. Carry circuit 436 is used as an AND gate to generate a product of the outputs of LUTs 432 and 434. Third slice 430 generates a sum of the Pterms for P2, P3, and P4 as its output, S3-out.

For the sample combinational logic circuit represented by equation EQ.1, carry circuits 416, 426, and 436 are utilized for the logical AND function. However, as already discussed, the carry circuits may be adapted as a bypass, an inverter, an AND gate, or an OR gate.

To complete the sum-of-products function of the sample circuit represented by equation EQ.1, fourth slice 440 may be configured to sum the outputs from the previous three slices 410, 420, and 430. For the sum function, LUT 442 may be configured to take the three slice outputs—S1-out, S2-out, and S3-out—as input to generate a sum 445. Here, LUT 444 is not used, and carry circuit 446 may be used as a bypass circuit. Thus, the resultant signal of fourth slice 440 becomes the output of CLB 400, SOP-out.

Figure 4B:
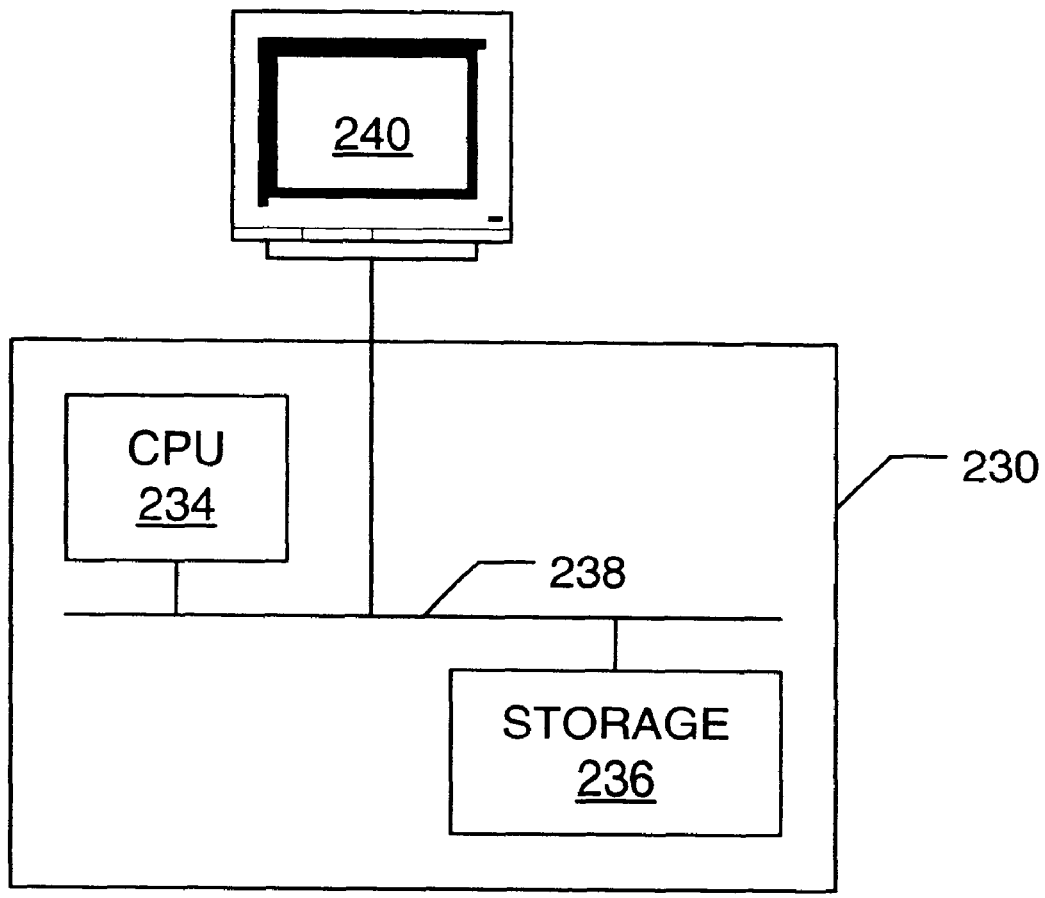
FIG. 4B illustrates a computing system programmed to perform literal-sharing decomposition of combinational logic.

FIG. 4B illustrates a computing system 230 having a processor 234 and storage 236. Storage 236 may be connected to processor 234 via a bus 238. Storage 236 includes a program that, when executed by the processor 234, causes system 230 to decompose combinational logic circuits expressed in sum-of-products format. The program implements the literal-sharing decomposition technique discussed above. System 230 may be connected to a display 240 for user interface. Storage 236 may be computer memory such as random access memory (RAM) or more permanent storage such as magnetic, optical, or other forms of machine storage.

As described, the literal-sharing decomposition allows combinational logic to be implemented using a reduced number of CLB slices. This reduction leads to reductions in both the logic delay and the routing delay, thus increasing the circuit performance. Moreover, the reduction in the number of required CLB slices saves FPGA area. In summary, applying literal-sharing decomposition techniques leads to faster implementation of logic circuits.

Section 2: CLB with a Second-Level Logic Circuit

Figure 5:
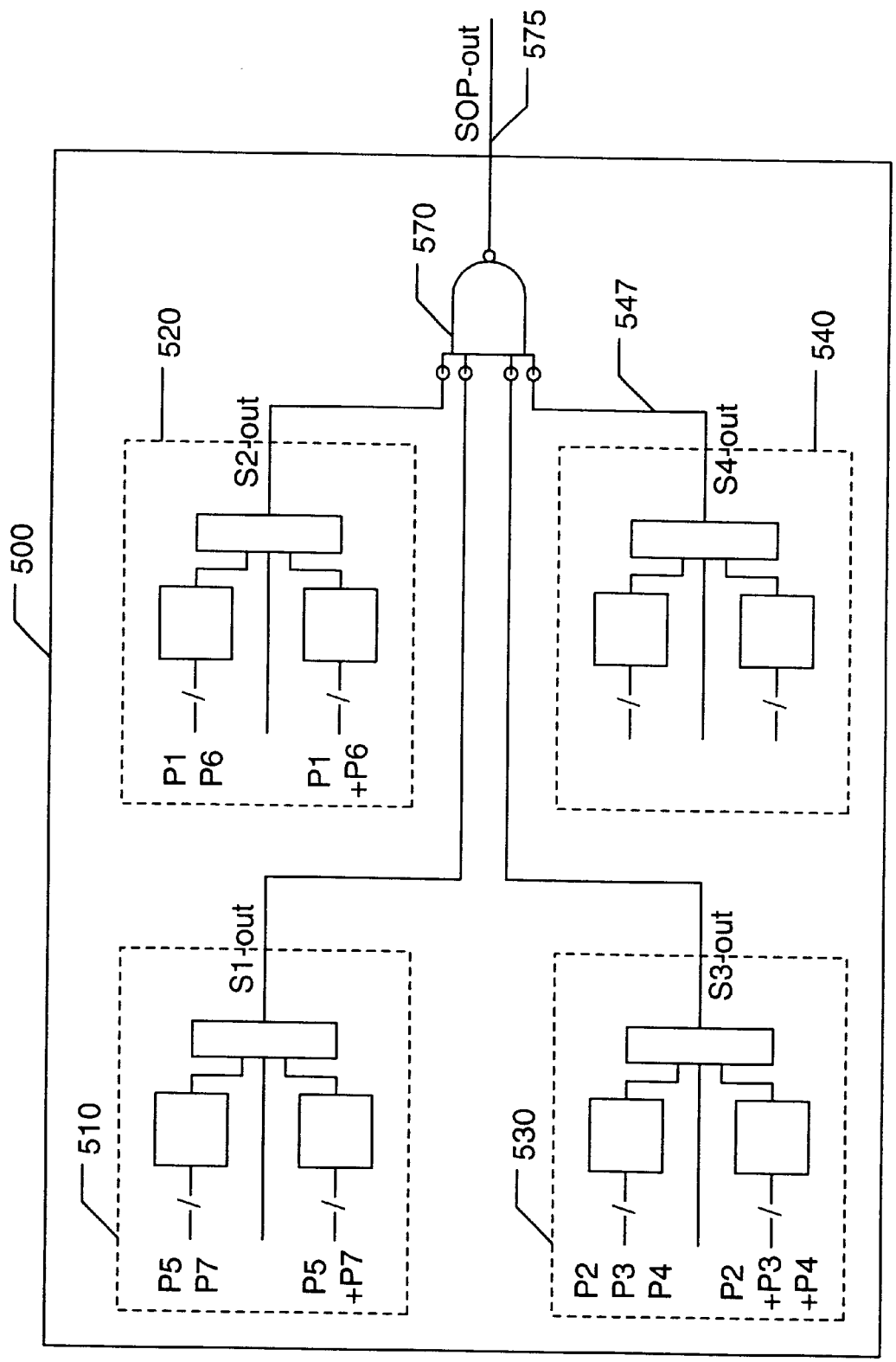
FIG. 5 illustrates one embodiment of a CLB in accordance with the present invention, including a second-level logic circuit.

The performance of the combinational logic circuits implementing sum-of-product functions may be further increased by adding a second-level logic circuit to a CLB. FIG. 5 illustrates a CLB 500 having four slices 510, 520, 530, and 540. CLB 500 also includes a second-level logic circuit 570. In the depicted embodiment, second-level logic circuit 570 is separate from slices 510, 520, 530, and 540.

In one embodiment, second-level circuit 570 may be an OR gate or its logical equivalent such as an inverted-input NAND gate 570 as illustrated. Second-level circuit 570 preferably has the same number of inputs as the number of slices in CLB 500, four in the illustrated CLB 500.

To aid the discussion, CLB 500 is configured to implement the sample combination logic circuit represented by equation EQ.1 and the personality matrix of TABLE 1. First slice 510 implements Chain P5+P7 and generates S1-out, the sum of Pterms P7 and P5. Second slice 520 implements Chain P1+P6 and generates S2-out, the sum of Pterms P1 and P6. Third slice 530 implements Chain P2+P3+P4 and generates S3-out, the sum of Pterms P2, P3, and P4. Circuit 570 sums the three outputs—S1-out, S2-out, and S3-out—to generate the final sum-of-products signal 575. Fourth slice 540 is not used in the present example.

The advantages of the present CLB design are numerous. First, circuit 570 frees up fourth slice 540, allowing CLB 500 to handle even wider fan-in nodes. Second, for combinational logic designs requiring all four slices to implement its Pterms, circuit 570 eliminates the need for another CLB slice that would have been required to perform the sum function but for circuit 570. Using another CLB slice would have increased the logic delay, the routing delay, and the area requirement. Finally, even for combinational logic that fits entirely within a single CLB, such as the case with the sample combinational logic circuit represented by equation EQ.1, circuit 570 increases the performance of the circuit because circuit 570 uses dedicated hardware, and therefore performs the sum operation faster than a configured LUT.

CLB 500 of FIG. 5 includes four slices 510, 520, 530, and 540. However, the CLB may contain any number of slices.

Section 3: CLB Slices with Combining Gate

Figure 6:
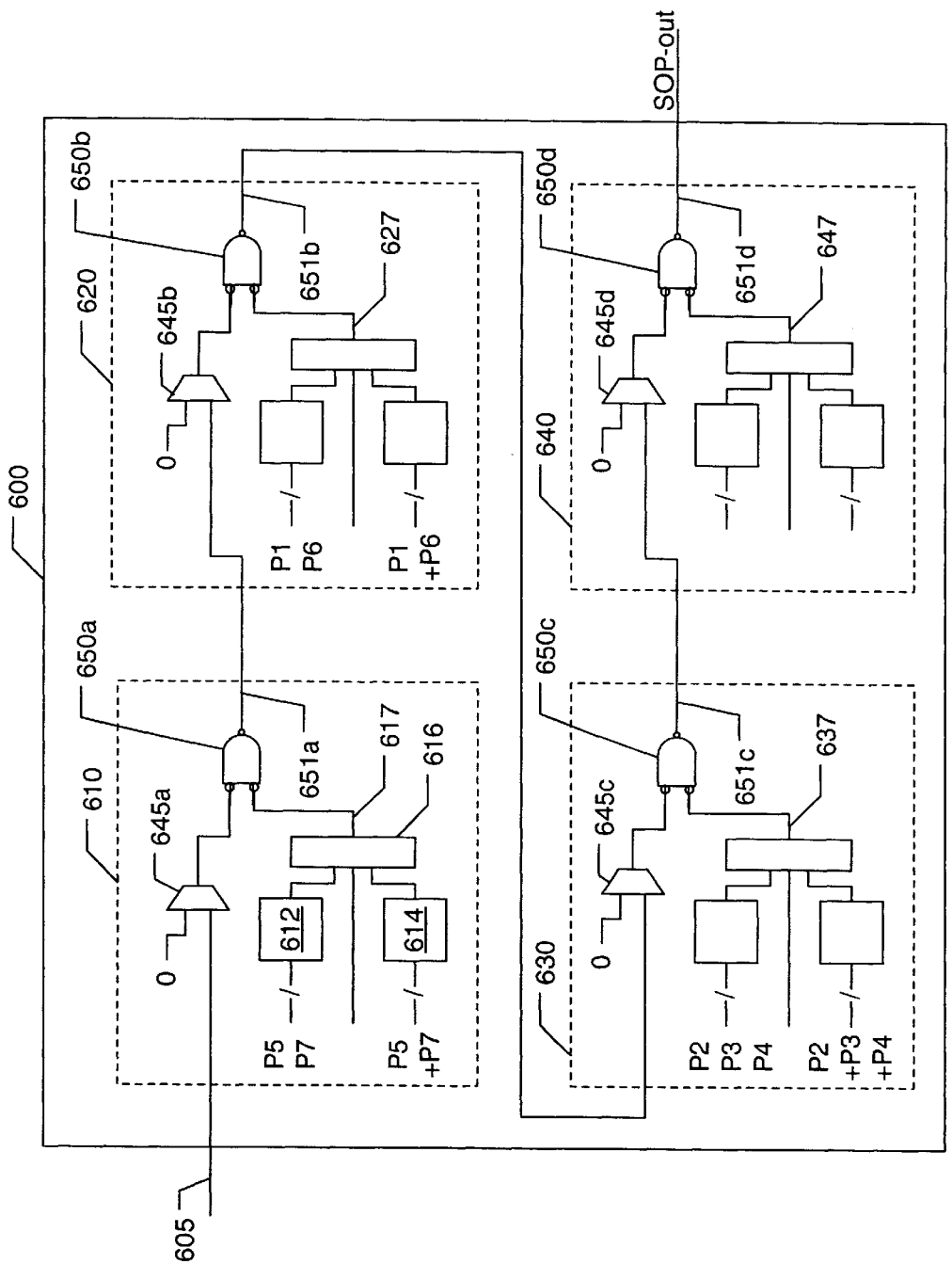
FIG. 6 illustrates an alternative embodiment of a CLB in accordance with the present invention, including a second-level logic circuit within CLB slices.

FIG. 6 illustrates an alternative embodiment of a CLB 600 for implementing SOP expressions. CLB 600 includes four similar slices 610, 620, 630, and 640. Each of the four slices 610, 620, 630, and 640 of the CLB 600 includes a combining gate in addition to the configurable function generators already discussed above.

Slice 610 includes configurable function generators 612, 614, and 616. As already discussed, configurable function generators 612 and 614 may be implemented as LUTs, and configurable function generator 616 may be implemented using multiplexers, flip-flops, or both. Configurable function generators 612, 614, or 616 receive a plurality of inputs and generate an output 617 which may be routed to one of two inputs of a combining gate 650a. In the one embodiment, combining gate 650a is a two-input OR gate (or a two-input NAND gate with inverted inputs). Circuit 650a combines the output 617 with a combining gate input 605. Combining gate input 605 may be from a previous CLB or a previous slice. Application of combining gate input signal 605 may be controlled using a multiplexer 645a. If combining gate input 605 is neither available nor needed, then multiplexer 645a may be programmed to pass a zero value rather than passing combining gate input 605. Circuit 650a generates an output 651a that is, in this configuration, a sum of its two inputs.

Other slices 620, 630, and 640 are likewise designed, each having their respective combining gates connected in series within the combining gate of a previous slice. That is, output 651a of circuit 650a of first slice 610 is the combining gate input to circuit 650b of second slice 620. circuit 650b generates output signal 651b. The signal 651b of circuit 650b of second slice 620 is the combining gate input to circuit 650c of third slice 630. circuit 650c generates output signal 651c. The signal 651c of circuit 650c of third slice 630 is the combining gate input to circuit 650d of fourth slice 640. Circuit 650d generates output signal 651d. These serially connected combining gates at each slice sum the respective Pterm of the slice and all the Pterms of the preceding slices. Accordingly, output signal 651d of fourth slice 640 is the sum of all the Pterms of the combinational logic being implemented. The serial connection inputs of gates 650a, 650b, 650c, and 650c, may be controlled by multiplexers 645a, 645b, 645c, and 645d, respectively, as discussed above in reference to multiplexer 645a.

This alternative embodiment of CLB 600 allows multiple CLBs to be connected serially to implement very wide fan-in nodes. This is possible because every slice of CLB 600 includes a combining gate, each taking a combining gate input.

Moreover, the alternative embodiment of CLB 600 may have manufacturing advantages because the combining gates exist within the slices, not separated from the slices. This allows the slices to be identical, making the circuit easier to scale.

As illustrated, CLB 600 of FIG. 6 includes four slices 610, 620, 630, and 640. However, CLB 600 may contain any number of slices and still provide advantages of the present invention.

Section 4: Dedicated Function Generator

Figure 1B:
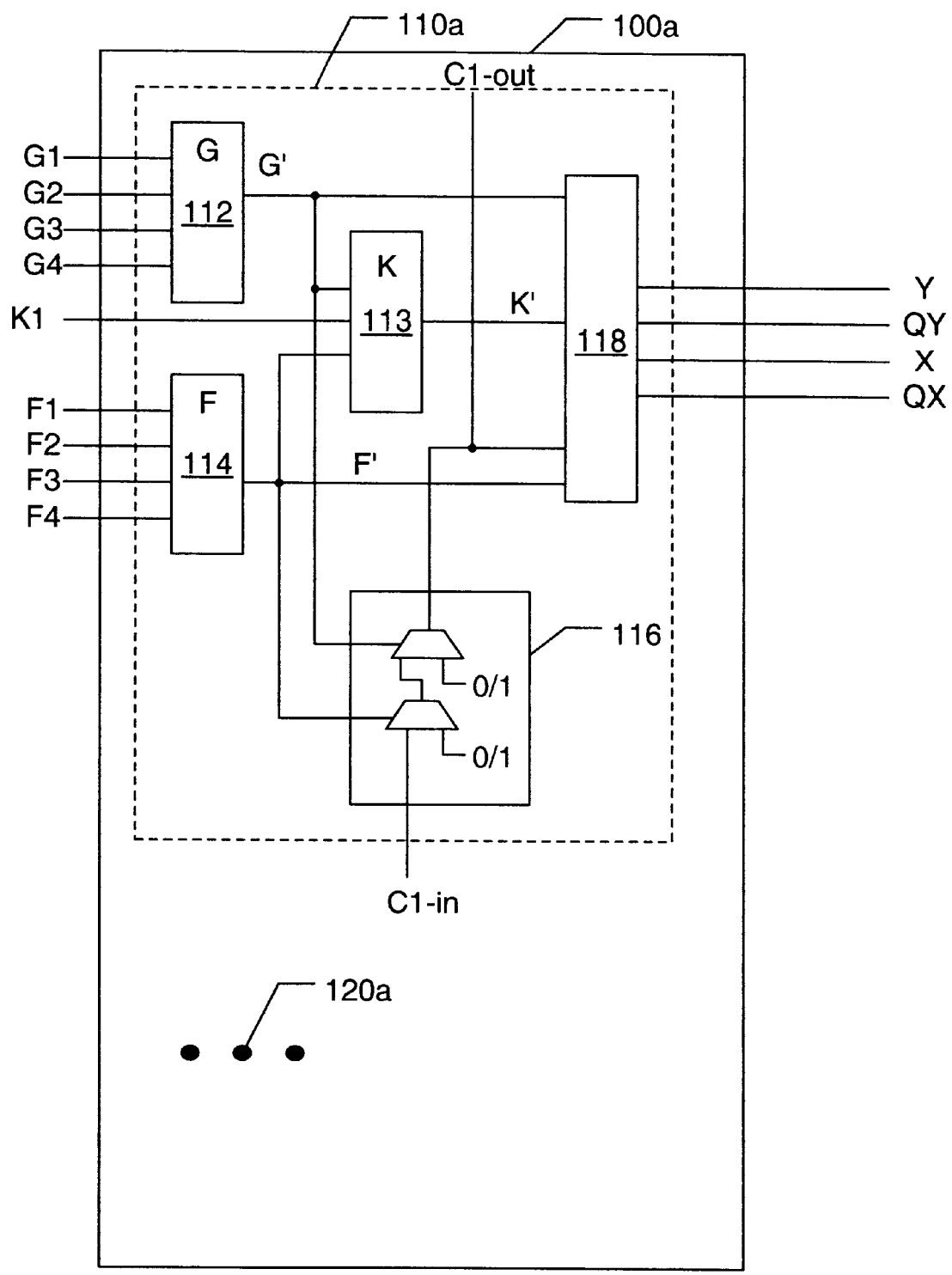
FIG. 1B illustrates another conventional configurable logic block (CLB)

The performance of the FPGA-implemented circuits may be increased even further by using a dedicated function generator (instead of a third LUT or a third function generator (the carry circuit)) to combine the results from the first two function generators (LUTs). As illustrated in FIGS. 1A and 1B, a third LUT 113 of FIG. 1B or a third function generator (carry circuit) 116 of FIG. 1A may be used as an inverter, an AND gate, or an OR gate.

The same three operations—invert, AND, or OR—can be performed faster if a dedicated function generator is used. The following description gives several inventive architectures that include dedicated function generators.

First Embodiment

The dedicated function generators are shown added to an architecture used in a Virtex™-II FPGA product available from Xilinx, Inc.

Figure 7:
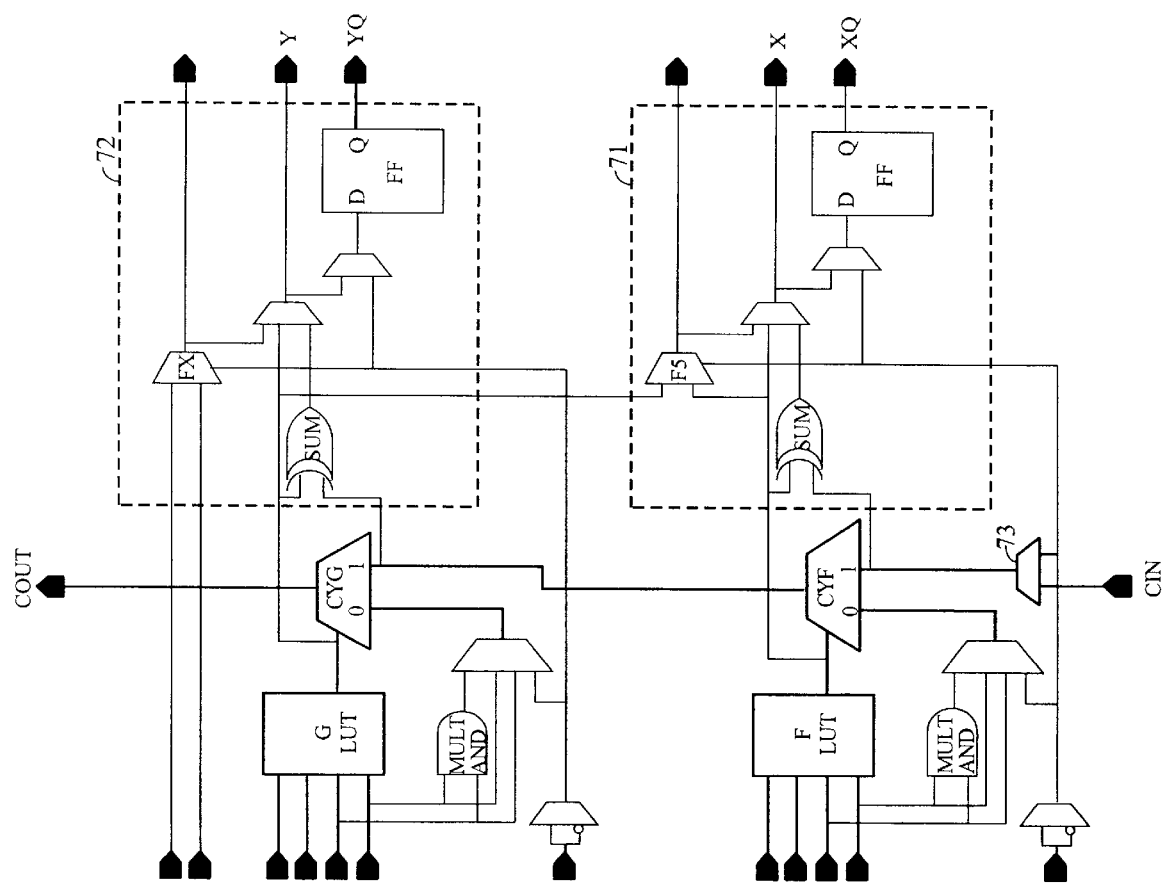
FIG. 7 illustrates a CLB slice according to a Virtex-II FPGA architecture.

FIG. 7 shows some of the components in a Virtex-II FPGA slice. The slice includes two LUTs F and G, a carry chain including two carry multiplexers CYF and CYG controlled by the F and G LUTs respectively and loaded or connected to another carry chain through multiplexer 73. Additional logic 71 and 72 includes summing, routing and storage elements, as shown. The Virtex-II FPGA architecture is discussed more thoroughly in the Virtex-II Platform FPGA Handbook published in January 2001 by Xilinx, Inc. The inventive structures of the present invention can be used with other architectures as well, as was discussed earlier.

Figure 8:
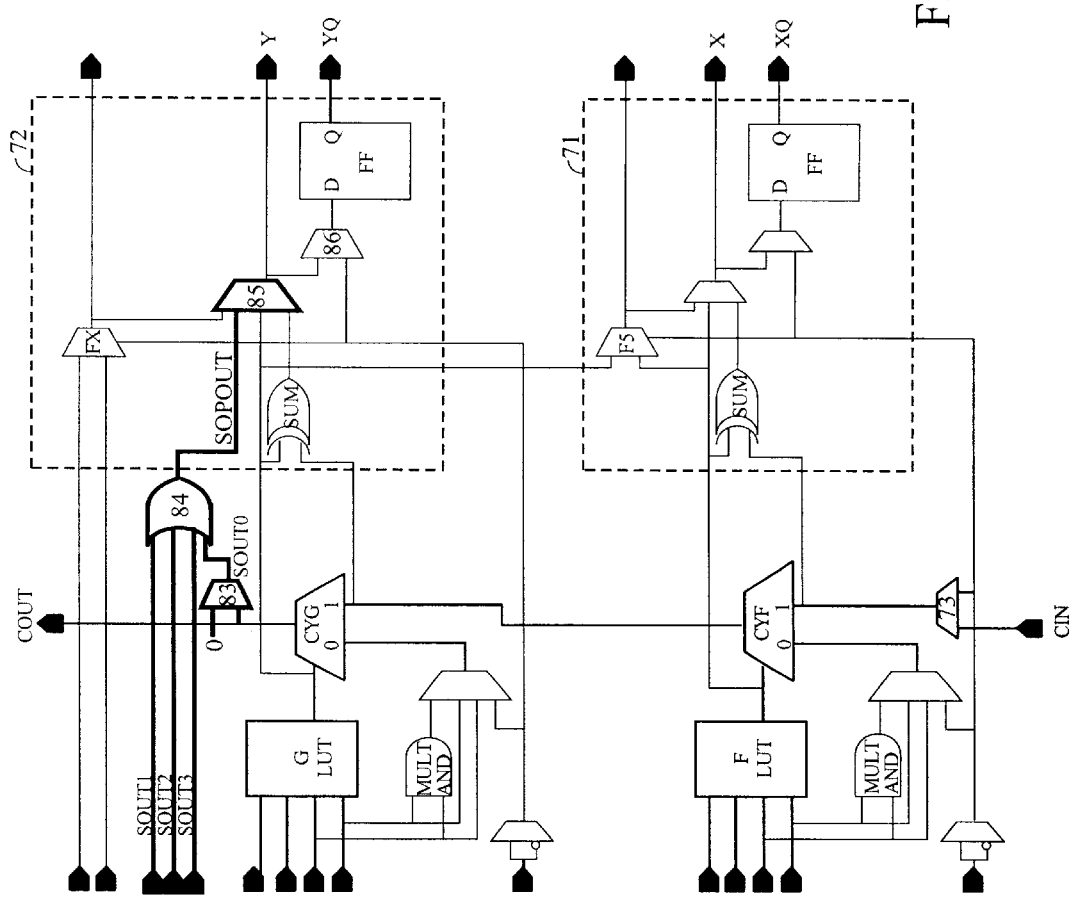
FIG. 8 illustrates a modification to the CLB slice of FIG. 7 to improve the implementation of wide functions according to the invention.

FIG. 8 shows an embodiment in which slice output signals SOUT0, SOUT1, SOUT2, and SOUT3 are routed through a multiplexer 83. (This multiplexer is shown only for the illustrated slice, but other slices also have an equivalent multiplexer.) OR gate 84 sums these four slice output signals SOUT0, SOUT1, SOUT2, and SOUT3 to generate an output signal labeled SOPOUT. If the SOUT signal comes from a carry chain and the carry chain is controlled by lookup tables configured to provide AND functions, then the SOPOUT signal is a sum-of-products output signal. Multiplexer 85 can be programmed to provide this signal as the output signal Y of the slice, and multiplexer 86 can be programmed to provide this signal to a flip flop to be stored. The dedicated hardware requires little chip area and because it is dedicated hardware, it is very fast.

Figure 9:
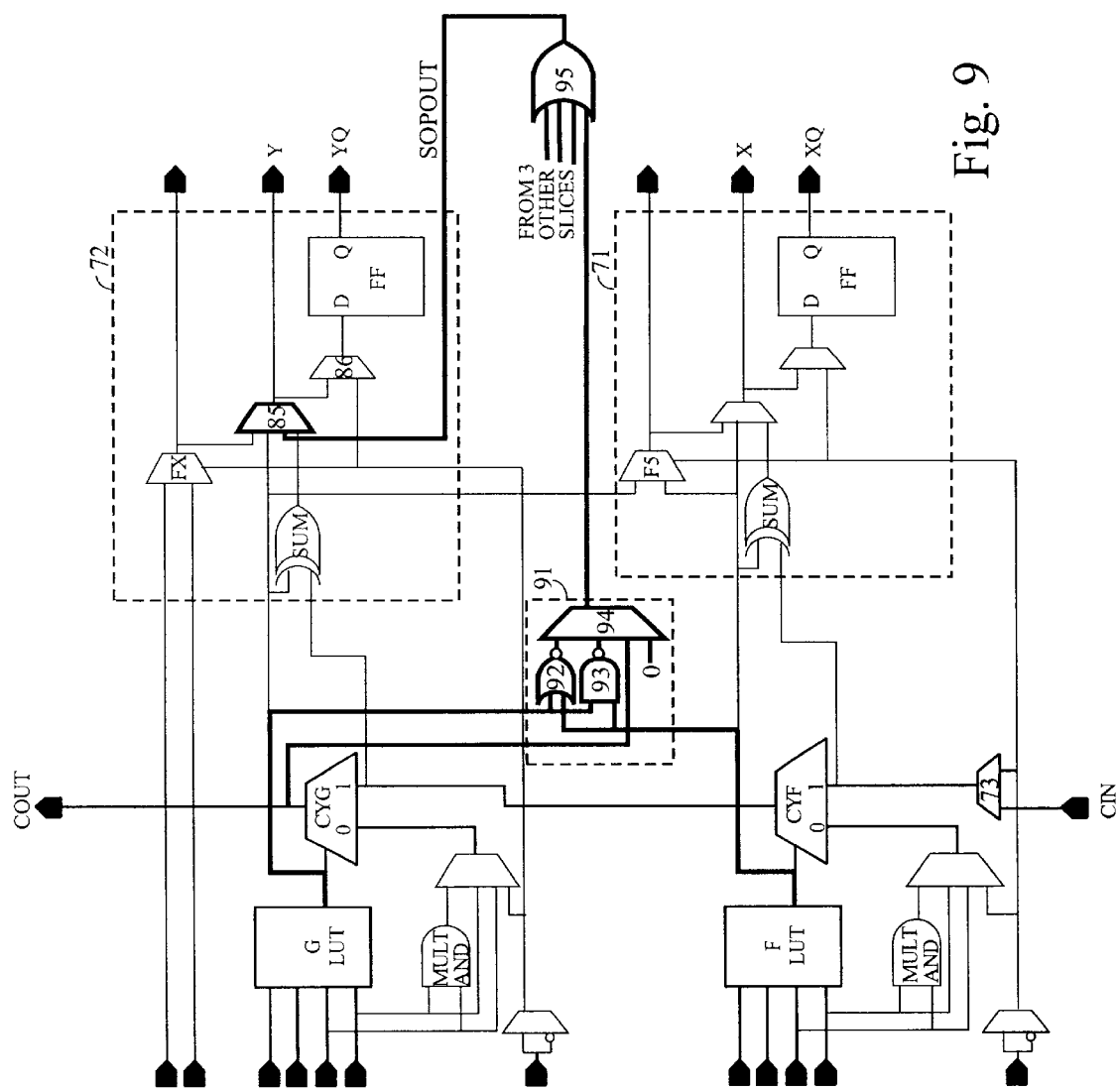
FIG. 9 illustrates an alternative modification to the structure of FIG. 7 to further improve the implementation of wide functions.

FIG. 9 shows an embodiment in which there are two stages of dedicated functions. Structure 91 receives input signals from the F and G function generators and from the CYG carry multiplexer. This structure 91 can provide the NAND, NOR, and carry-out (SOUT) of the F and G function generator signals plus a constant 0 (to disable its effect on an OR gate) to a multiplexer 94. OR gate 95 receives the output of multiplexer 94 as well as equivalent signals from three other slices. Thus the output signal from OR gate 95 can be the sum-of-products output signal and is thus labeled SOPOUT. This output signal is provided to multiplexer 85 for either storage through multiplexer 86 into a flip flop or direct output Y of the slice.

Figure 10:
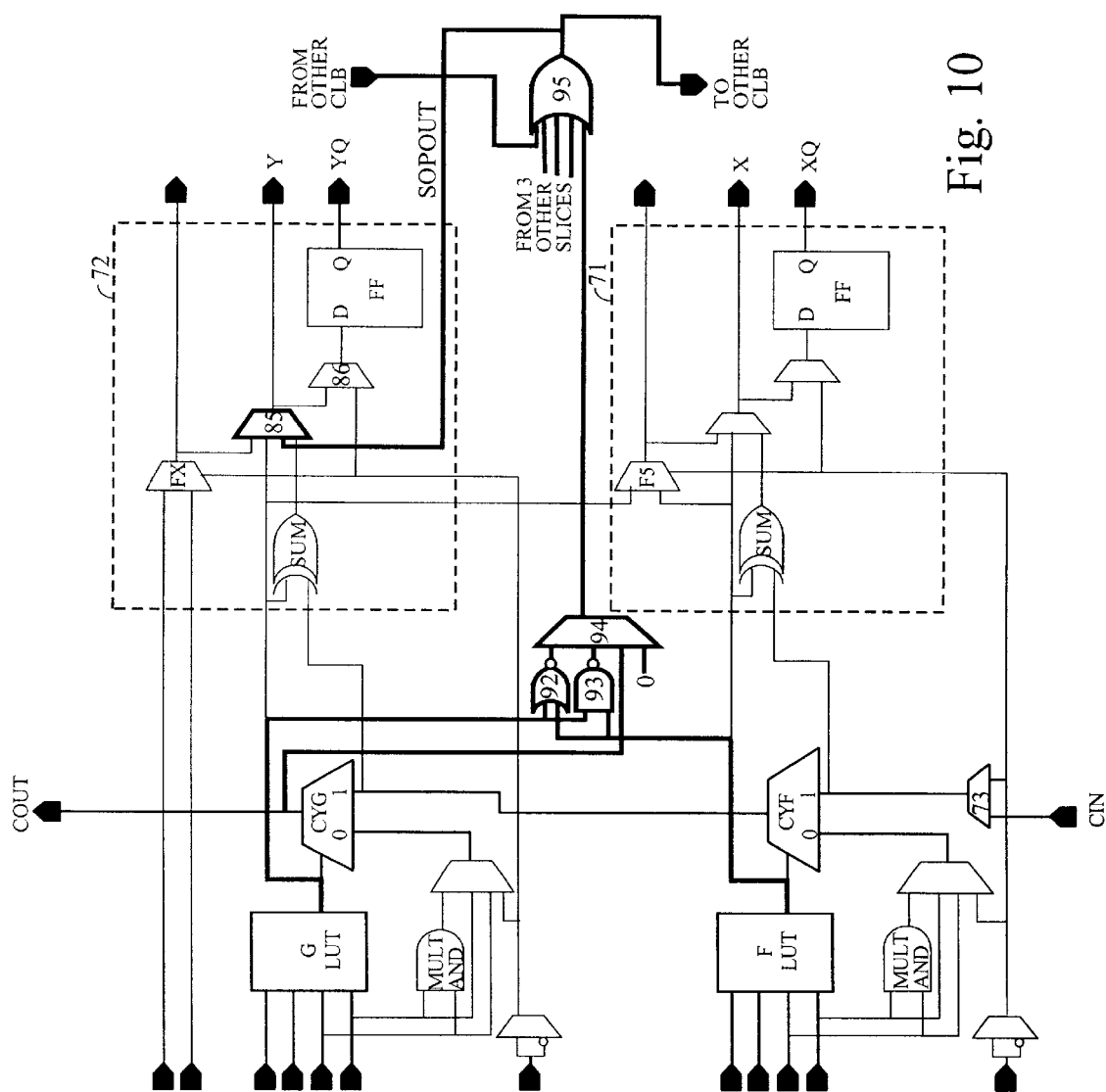
FIG. 10 illustrates a further modification of FIG. 9 to handle even wider functions.

FIG. 10 is a modification to FIG. 9 to allow for generating wider sum-of-product functions. OR gate 95 receives, in addition to the signals shown and discussed for FIG. 9, an input signal from another CLB. In the Virtex-II device of the present example, a CLB includes four of the slices illustrated in FIG. 10. The output signal from OR gate 95 is provided to multiplexer 85 within the same slice and also to another OR gate 95 in another slice. Thus, the embodiment of FIG. 10 allows for cascading even wider sum-of-products functions.

Figure 11:
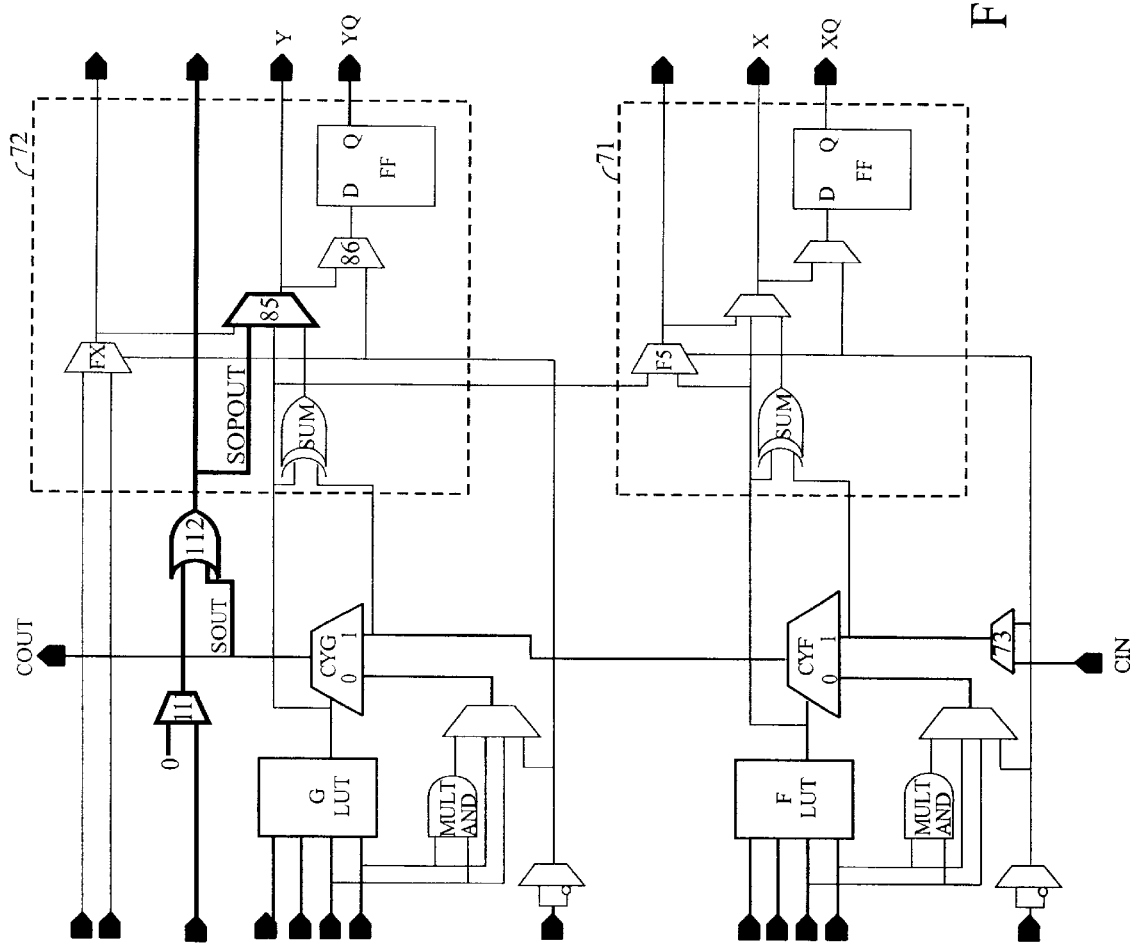
FIG. 11 illustrates another modification to the CLB slice of FIG. 7 to cascade certain functions, particularly SOP functions.

FIG. 11 shows an embodiment in which the structure of FIG. 7 is modified to include an OR chain that forms a Boolean sum and thus allows AND functions (products) to be generated on vertical carry chains and OR functions (sums) to be generated in the horizontal OR chain. Each slice includes an OR gate 112 receiving inputs from the CYG output signal and a multiplexer 111. Multiplexer 111 allows the OR chain to be started at the slice, and multiplexer 85, which receives the output signal from OR gate 112, allows the cumulative SOPOUT signal to be provided as an output signal Y of the slice or stored in the flip flop.

Figure 11A:
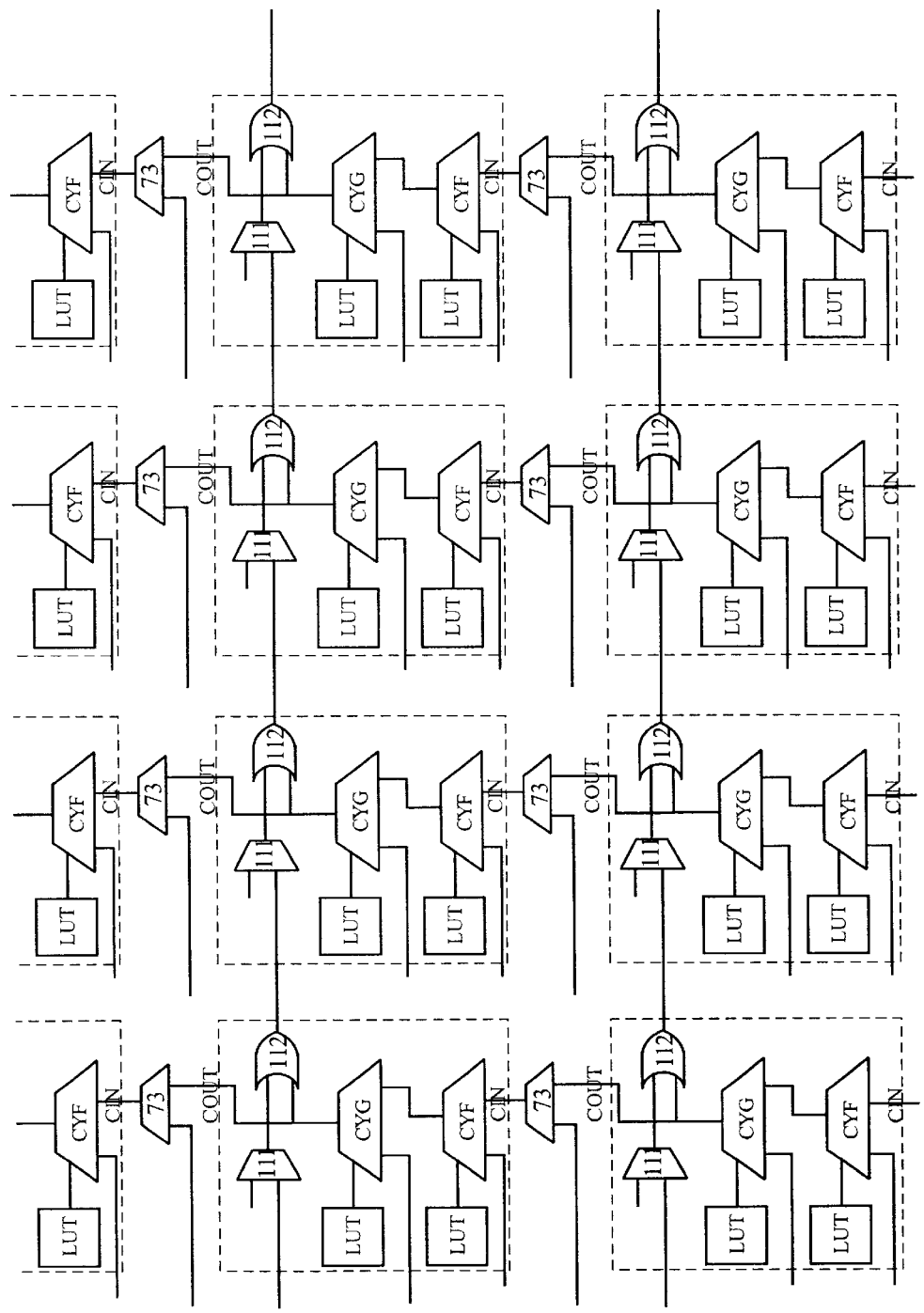
FIG. 11a illustrates a simplified version of the embodiment of FIG. 11 showing the connections between slices.

FIG. 11a shows an overview of the structure of FIG. 11. Several slices are shown to illustrate the relationship between the OR gates 112 and multiplexers 111 for forming the horizontal OR chains and the vertically extending carry chains including multiplexers 73 for starting the carry chains in each slice.

Figure 11B:
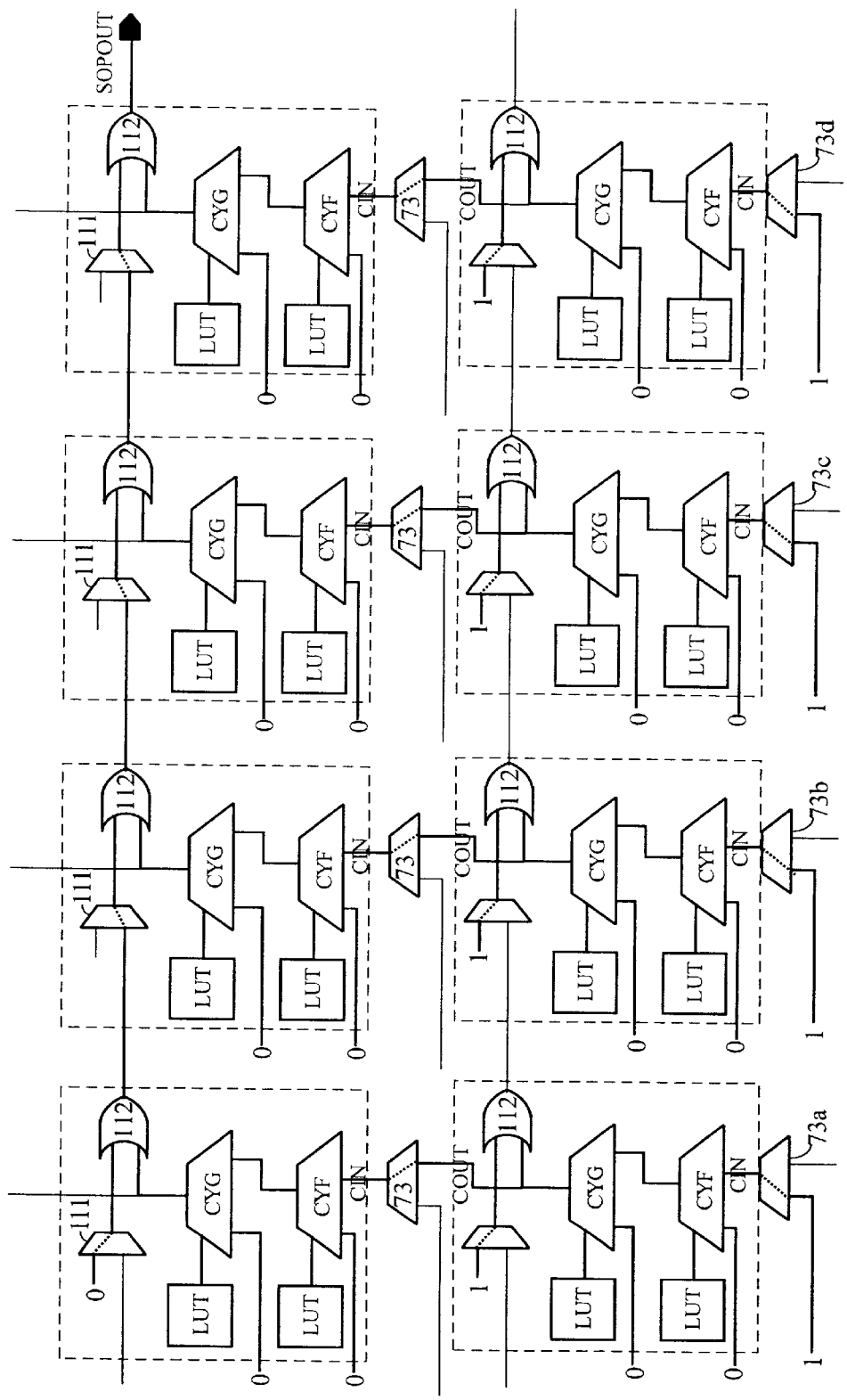
FIG. 11b shows a configuration of the structure of FIG. 11a to form a sum-of-products function.

FIG. 11b illustrates a configured structure of FIG. 11a. In the example of FIG. 11b, the user has configured the structure to generate a sum-of-products function using an array with the height of four lookup tables (the height of two slices) and the width of four slices. All lookup tables are configured to generate the AND function. Logic 1 values are applied to multiplexers 73a, 73b, 73c, and 73d. Only if all input signals to a lookup table are logic 1 will the lookup table cause its carry multiplexer to propagate its carry-in signal CIN. Thus, only if all lookup tables controlling a carry chain output logic 1 will the logic 1 applied to one of multiplexers 73a–73d propagate to one of OR gates 112. If any of OR gates 112 propagates a logic 1, the logic 1 will continue to propagate to the right-most output terminal. Thus this terminal provides the SOPOUT signal, or the sum-of-products output signal.

Figure 12:
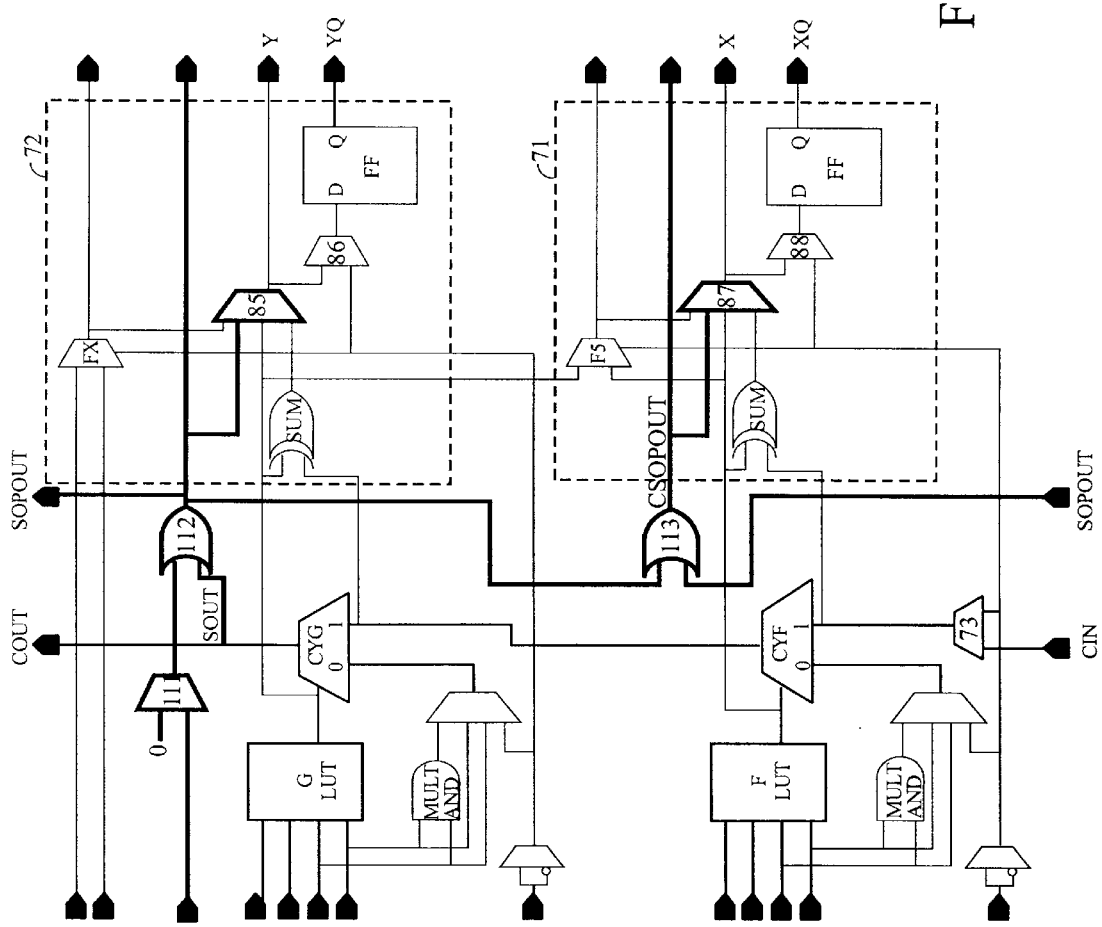
FIG. 12 shows a further modification to the CLB slice of FIG. 11 to allow for faster generation of sum-of-product functions.

FIG. 12 illustrates yet another embodiment, building on the structure of FIG. 11. In FIG. 12, an additional OR gate 113 allows sum-of-products functions requiring wide OR functions to be implemented faster than does the structure of FIG. 11. OR gate 113 receives as input signals the SOPOUT signals from two adjacent slices, its own slice and the slice below. Multiplexer 87 is modified from earlier embodiments to be a 4-input multiplexer instead of a 3-input multiplexer. If a sum-of-products function has several AND terms of no more than 9 inputs and other AND terms of more than 9 inputs, the embodiment of FIG. 12 will work well.

Figure 12A:
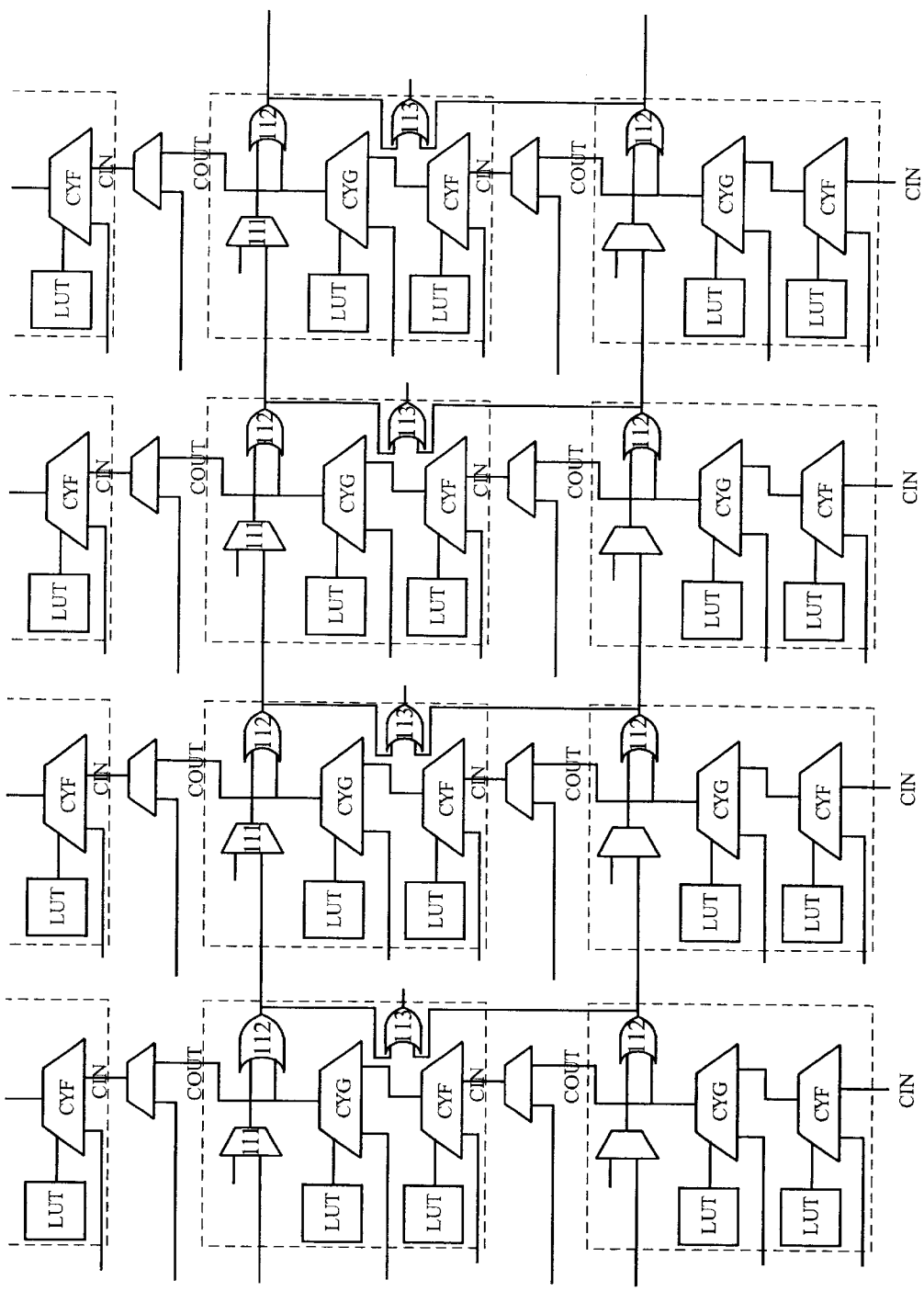
FIG. 12a illustrates a simplified version of the embodiment of FIG. 12 showing the connections between slices.
Figure 12B:
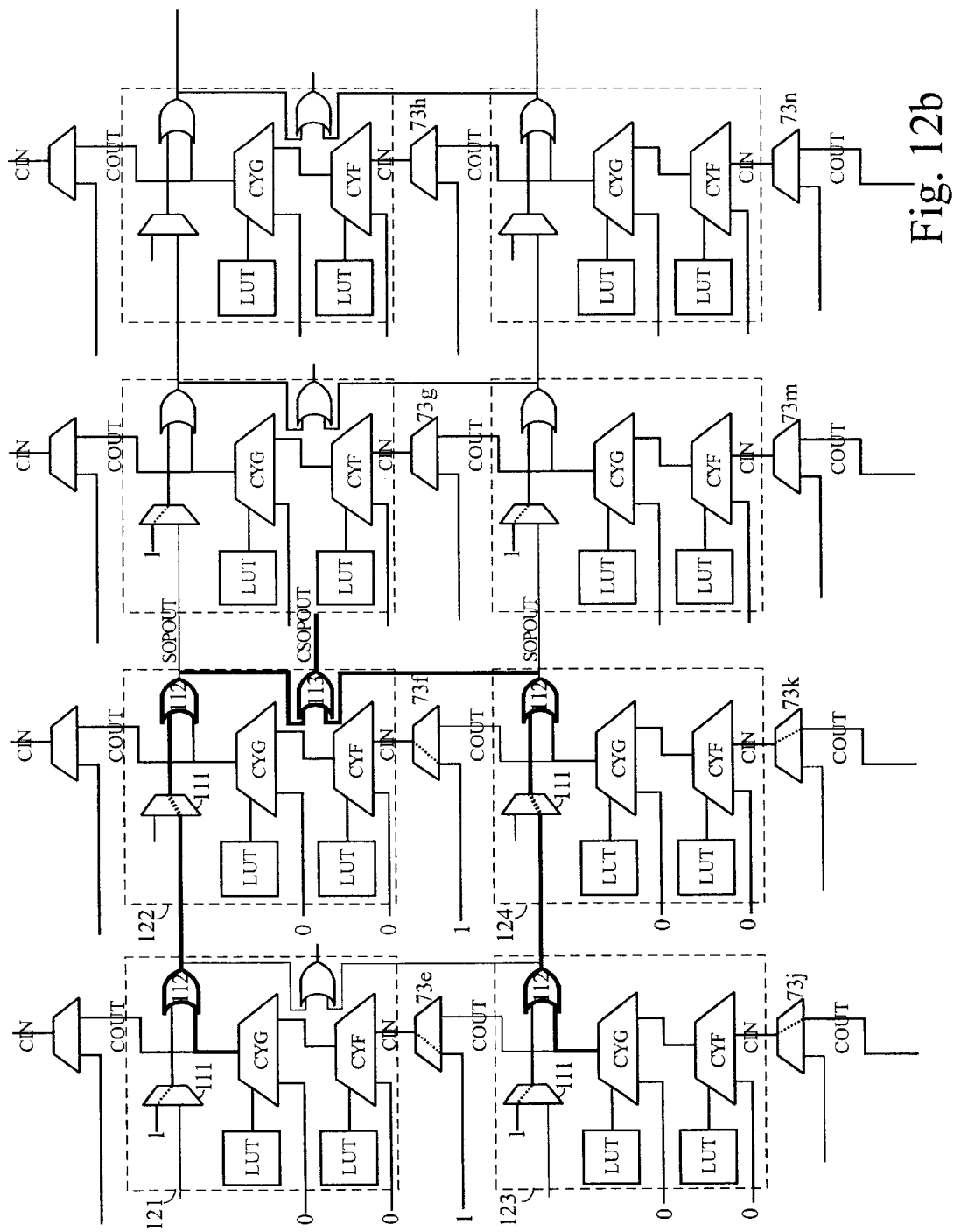
FIG. 12b shows a configuration of the structure of FIG. 12a to form a fast sum-of-products function.

FIGS. 12a and 12b illustrate the overview of FIG. 12 and an example. FIG. 12a shows how one OR gate 113 is provided for every other slice while one OR gate 112 is provided for each slice. In another embodiment one OR gate 113 is provided for each slice.

FIG. 12b shows a configuration making use of OR gate 113 to achieve a very fast sum-of-products function. Rather than generate four AND functions in four adjacent columns as shown in FIG. 11b, the example of FIG. 12b uses only two columns. Slices 121 and 122 each generate AND functions of less than nine input signals, making use of the lookup tables and carry multiplexers CYF and CYG in the respective slice. Slices 123 and 124 generate AND functions of more than eight input signals, using multiplexers 73j and 73k to pass signals from additional slices below. Multiplexer 111 in slice 123 causes OR gate 112 to pass the output signal from multiplexer CYG in slice 123 to multiplexer 111 in slice 124, which is programmed to pass the signal to OR gate 112 in slice 124. This OR gate forms the SOPOUT function of slices 123 and 124.

Similarly, multiplexer 111 in slice 121 causes OR gate 112 in slice 121 to pass the CYG output signal of slice 121 to multiplexer 111 of slice 122, which is programmed to pass this signal to OR gate 112 of slice 122, which forms the sum-of-products with the CYG output of slice 122. Finally, OR gate 112 combines the SOPOUT output signals from slices 122 and 124 to generate the combined sum-of-products signal CSOPOUT. The CSOPOUT signal is generated more quickly than if the implementation of FIG. 11b had been used. This is because the four OR gate delays of FIG. 11b are replaced by 3 OR gate delays in FIG. 12b.

Second Embodiment

The example of FIGS. 7 to 12b generate a sum-of-products function using the carry chain to generate the product function and several alternative structures to generate the sum-of-products function. In another embodiment, a chain other than the carry chain is used to combine functions and thus generate the product function. FIGS. 13–22 show this embodiment.

Configurable Logic Element (CLE)

Figure 13:
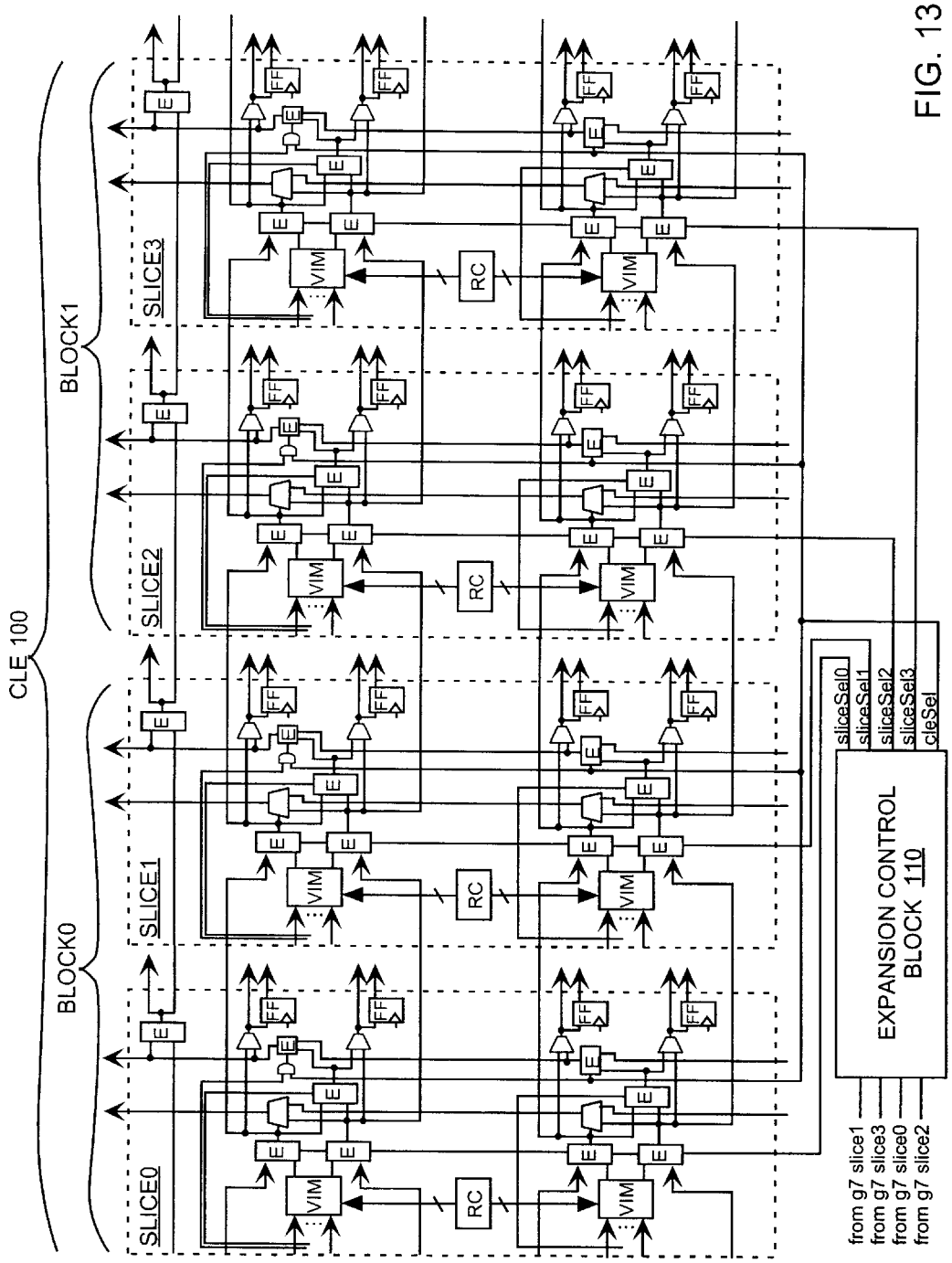
FIG. 13 is a high-level diagram for a CLE according to one embodiment of the present invention. The CLE includes four "slices".

FIG. 13 is a high-level diagram for a Configurable Logic Element (CLE) 100 according to one embodiment of the present invention. CLE 100 comprises four "slices", which in this embodiment are essentially identical. The slices are denoted slice 0, slice 1, slice 2, and slice 3. Two slices together form what is called a "block". Slices 0 and 1 together form block 0. Slices 2 and 3 together form block 1.

Each slice includes two Versatile Implementation Modules (VIMs), logic blocks that can function as either LUTs or product term generators. Therefore, each CLE includes eight VIMS. In one embodiment, the VIMs function as described below in conjunction with FIG. 15. In other embodiments (not pictured) logic blocks other than VIMs are used. For example, where PAL (Programmable Array Logic) functionality is not desired, standard lookup tables (LUTs) can be substituted for the VIMs in FIG. 13. Similarly, where LUT functionality is not desired, standard product term generator logic blocks can be substituted for the VIMs in FIG. 13.

The CLE also includes several "expanders" that allow the VIMs to be used together to form functions with more inputs than are available using a single VIM. In FIG. 13, elements acting as expanders in CLE 100 are designated with the letter "E". Using these expanders, each VIM can be grouped with any adjacent VIM, either vertically or horizontally. In some embodiments, non-adjacent VIMs can also be grouped, by setting the expanders associated with bypassed VIMs to "Feedthrough" modes. In the pictured embodiment, expanders can be used to interconnect VIMs within a single slice, between slices in the same CLE, or between two or more CLEs. Thus, the size of a VIM complex (i.e., a group of VIMs associated using expanders to implement a user circuit) is not limited to the number of VIMs in a single CLE.

Each slice also includes four memory elements (designated FF), and a RAM control block (designated RC) that controls the memory arrays within the two VIMs of the slice. In this embodiment, the memory elements and RAM control block are similar to known CLE elements and are not part of the expander network.

CLE 100 also includes an expansion control block 110 that controls the expanders in each slice using an associated slice select signal and a CLE select signal. The sliceSe10 signal selects slice 0, sliceSel1 selects slice 1, and so forth. (In the present specification, the same reference characters are used to refer to terminals, signal lines, and their corresponding signals.) The slice select signals control the horizontal expander chain. Expansion control block 110 also provides a CLE-wide expander control signal, cleSel. Signal cleSel controls the vertical expander chain, and also enables or disables the slice select signals, as shown in FIG. 16A. The functions of expansion control block 110 and the slice and CLE select signals are explained in detail in conjunction with FIG. 17. In addition, the slice and CLE control signals can be used to provide additional data inputs when implementing large user circuits, as shown in later exemplary figures.

Figure 14:
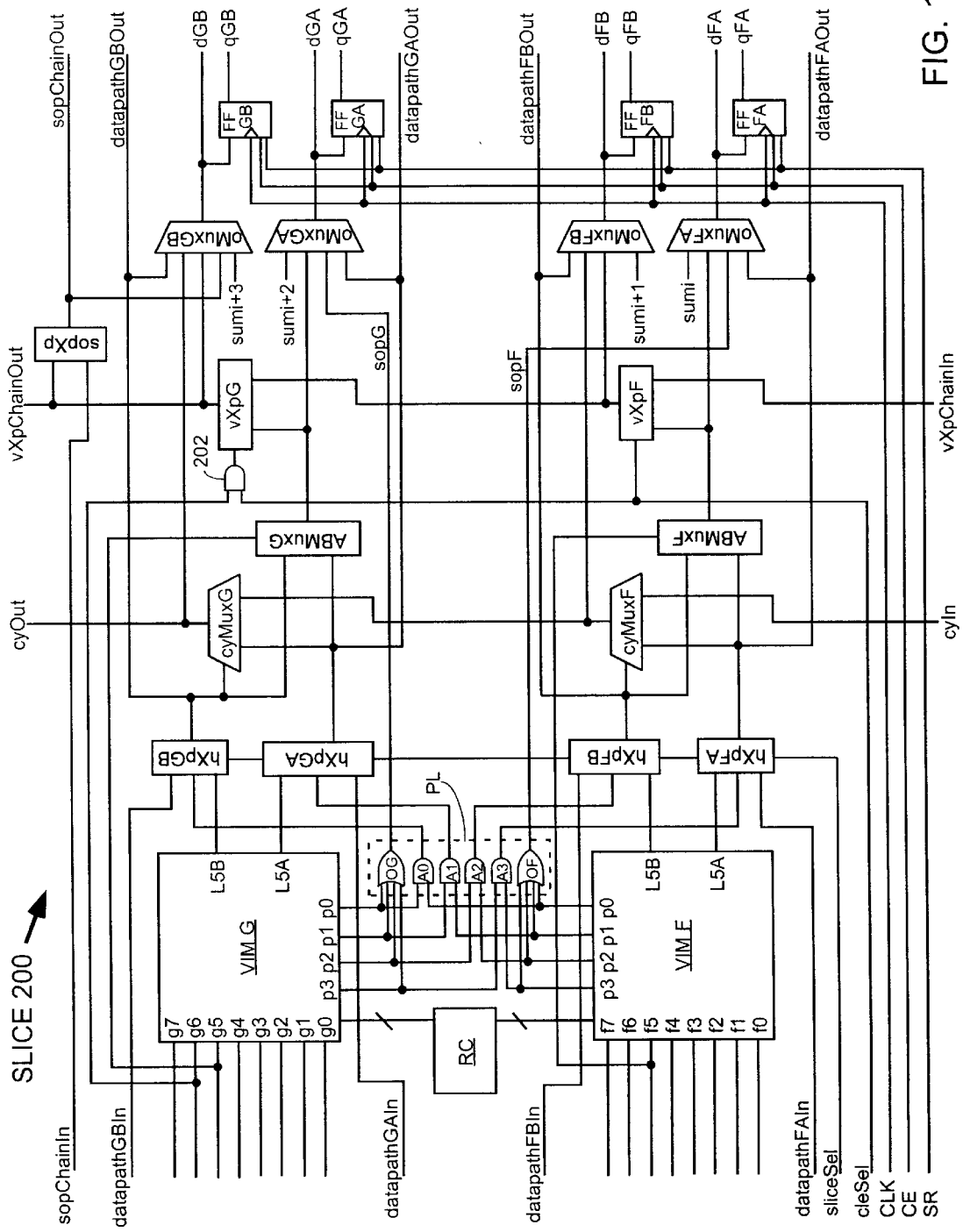
FIG. 14 is a more detailed view of a single slice from the CLE of FIG. 13.

FIG. 14 shows a more detailed view of a single slice according to one embodiment. The pictured slice 200 includes two VIMs, VIM F and VIM G. The RAM functionality of each VIM is controlled by the RAM control block RC. The RAM control block and RAM control signals can be, for example, similar to those included in the CLE of the Virtex (TM)-II family of FPGAs available from Xilinx, Inc. The Virtex-II CLE is described on pages 46–54 of the "Virtex (TM)-II Platform FPGA Handbook", published January 2001 and available from Xilinx, Inc., 2100 Logic Drive, San Jose, Calif., which pages are hereby incorporated by reference.

Each VIM provides two 5-input LUTs with output signals L5A, L5B, or four 8-input product terms (Pterms) with output signals p0–p3. (The VIM is described in more detail in conjunction with FIG. 15, below.) The four Pterm output signals of each VIM drive PAL logic block PL, which combines the Pterm output signals to generate sum-of-product functions (using OR-gates OF and OG) and larger Pterms (using AND-gates A0–A3). OR-gate OF generates the OR-function of the four 8-input Pterms provided by VIM F. OR-gate OG generates the OR-function function of the four 8-input Pterms provided by VIM G. AND-gates A0–A3 each provide a single Pterm of up to 16 inputs by combining 8-input Pterms from each of the two VIMS.

In one embodiment (not shown), AND-gates A0–A3 are also configurable as OR-gates. In this embodiment, a single slice can generate four sum-of-product functions, each having two 8-input Pterms.

Returning to FIG. 14, elements of the slice similar to those of known FPGA architectures include: carry multiplexers (cyMuxF, cyMuxG) implementing a vertical carry chain between carry input signal cyIn and carry output signal cyOut; output multiplexers (oMuxFA, oMuxFB, oMuxGA, oMuxGB) generating unregistered data output signals (dFA, dFB, dGA, dGB); and flip-flops (FA, FB, GA, GB) accepting the unregistered data signals and generating corresponding registered data output signals (qFA, qFB, qGA, qGB). In the described embodiment, other logic in the CLE (not shown) generates other optional output signals that are also supplied to the output multiplexers, e.g., arithmetic sum signals sumi, sumi+1, sumi+2, sumi+3.

Versatile Implementation Module (VIM)

Figure 15:
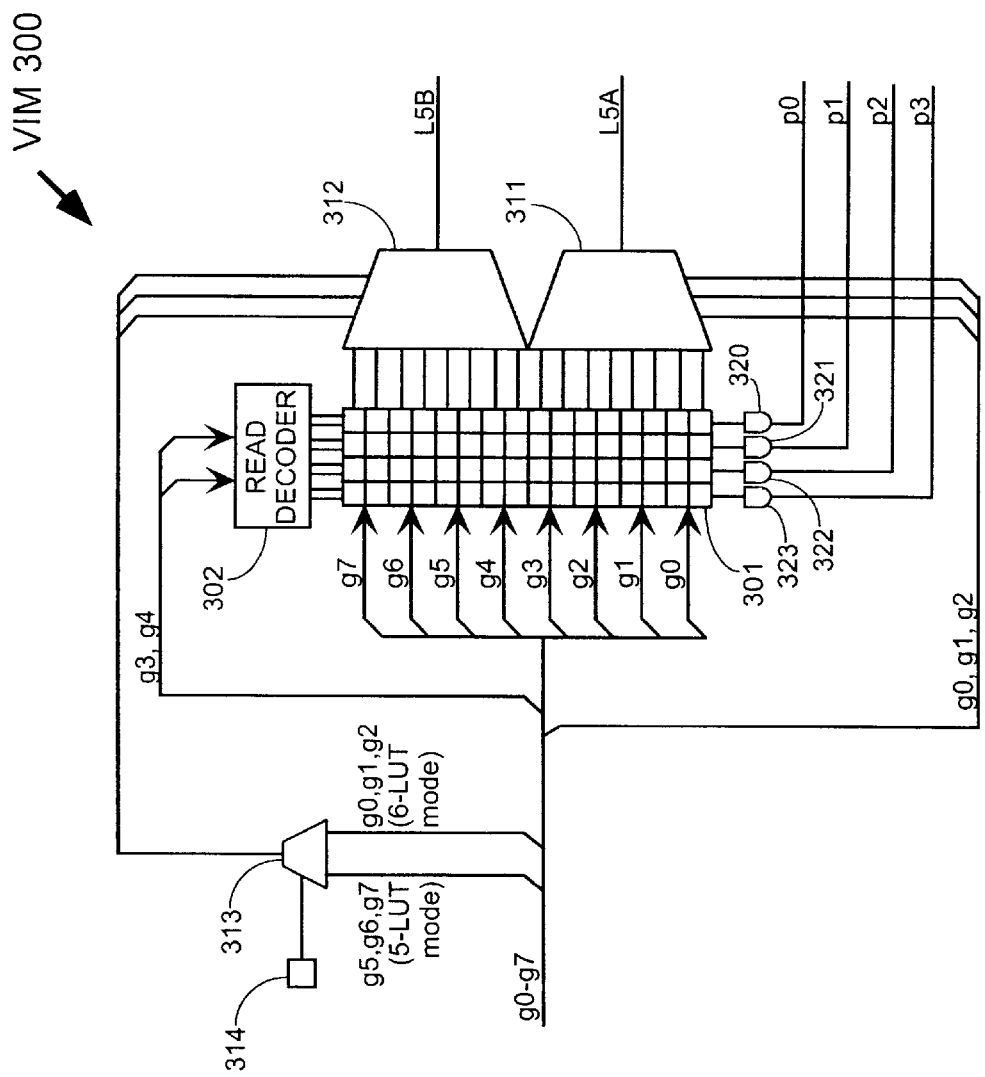
FIG. 15 is a simplified diagram of a combination LUT/PAL structure (a "VIM") that can be used with the slice of FIG. 14.

FIG. 15 is a functional diagram of a Versatile Implementation Module (VIM) 300. A VIM is a combination LUT/PAL structure that can be included in the slice of FIG. 14. The logical functions diagrammed in FIG. 15 can be implemented in many different ways. Further, logic blocks other than VIMs can be used with the expanders of the present invention. The VIM shown in FIG. 15 is provided for exemplary purposes only. Some portions of exemplary VIM 300 not described in detail herein are similar to those shown and described by Wittig et al. in U.S. Pat. No. 6,150,838.

The VIM of FIG. 15 operates either as two 5-input lookup tables (in 5-LUT mode and 6-LUT mode) or as an 8-input product term generator (in PAL mode). VIM 300 includes a memory cell array 301 with sixteen rows and four columns. In either of the LUT modes, read decoder 302 decodes two of the data inputs (g3, g4) to select the output of one of the four memory cells of each row. Three additional data inputs (g0, g1, g2) control 8:1 multiplexer 311 to select one of the bottom eight rows of memory cells to provide 5-LUT output L5A. Thus, 5-LUT output L5A implements a lookup table of the five data inputs g0–g4. Similarly, in 5-LUT mode three data inputs (g5, g6, g7) control 8:1 multiplexer 312 to select one of the top eight rows of memory cells to provide 5-LUT output L5B. Thus, when the VIM is in 5-LUT mode, 5-LUT output L5B implements a lookup table of the five data inputs g3–g7.

Whether the VIM is in 5-LUT mode or 6-LUT mode is controlled by multiplexer 313, which in turn is controlled by a value in configuration memory cell 314. Multiplexer 313 selects either data inputs g5, g6, g7 (in 5-LUT mode) or data inputs g0, g1, g2 (in 6-LUT mode) to control multiplexer 312.

When the VIM is in 6-LUT mode, the signals on the two L5 output terminals are controlled by the same multiplexer select signals. Therefore, data inputs g0, g1, g2 control both multiplexers 311 and 312 in 6-LUT mode, and each multiplexer provides a different function of data inputs g0–g4. These two 5-input function outputs are then combined using the AB expander (ABMux) shown in FIG. 14, configured as a multiplexer controlled by the g5 data input. Therefore, the AB expander provides the 6-input LUT function of data inputs g0–g5.

In PAL mode, pairs of the memory cells operate together as content addressable memory (CAM) cells. Each of eight data inputs (g0–g7) is provided to one pair of memory cells in each column. AND gate 320, coupled to the fourth column of memory cells, can provide any desired product term (Pterm) of any or all of the eight signals g0–g7 to output terminal p0. Similarly, AND gates 321–323 can provide any desired Pterm of signals g0–g7 to output terminals p1–p3, based on the contents of the third, second, and first columns of memory cells, respectively. Consequently, when in PAL mode, VIM 300 can implement four 8-input Pterms. The output signals from AND gates 320–323 (p0–p3) are then provided to 4-input OR gates OF and OG in FIG. 14 to implement sum-of-products functions. Alternatively, signals p0–p3 are provided to 2-input AND gates A0–A3, which are then combined using expanders to implement larger product terms and sum-of-product functions, as described in conjunction with FIGS. 17–20.

It is therefore seen that VIM 300 of FIG. 15 can be used to implement either two 5-input LUTs or one 6-input LUT (with the AB expander) when in LUT mode, or an 8-input Pterm generator providing four Pterms in a PAL mode. The VIM structure is efficient in that it uses common memory circuitry to implement either the LUT or the Pterm function. The structure is also relatively fast in either mode when implementing user circuits of no more than six inputs for a LUT or eight inputs for a Pterm. To implement user circuits with more than six or eight inputs, the VIMs can be cascaded or otherwise combined using programmable interconnect in traditional fashion. However, the present specification supplies a more desirable structure and method for implementing these larger circuits.

Expanders

The various VIM output signals, PAL logic output signals, and signals from other slices are configurably combined using expanders (see FIG. 14). The horizontal expanders (hXpFA, hXpFB, hXpGA, hXpGB) form four horizontal expander chains. For example, horizontal expander hXpFA forms a data path from datapathFAIn to datapathFAOut. The vertical expanders (vXpF, vXpG) form a vertical expander chain from vXpChainIn to vXpChainOut. The vertical expanders can be used to combine signals from the horizontal expander chains, by passing the output signals from the horizontal expanders through the AB expanders to the vertical expander input terminals. The "sum-of-products" or SOP expanders (sopXp) form a horizontal chain from sopChainIn to sopChainOut, driven by signals from the vertical expander chain. The AB expanders (ABMuxF, ABMuxG) can be used to combine two signals from the associated VIM, PAL logic, or horizontal expander chain, or to access the vertical expander chain.

Most expanders are the same for each of the two VIMs in the slice. For example, the horizontal expanders for VIM F (hXpFA, hXpFB) are the same as the horizontal expanders for VIM G (hXpGA, hXpGB). In fact, all four horizontal expanders function in the same way. When functioning as a 2:1 multiplexer, all are controlled by the slice select signal (sliceSel) associated with the slice. Similarly, the AB expander for VIM F (ABMuxF) is the same as the AB expander for VIM G (ABMuxG). When functioning as a 2:1 multiplexer, each AB expander (ABMuxF, ABMuxG) is controlled by a data input signal (f5, g5) from the corresponding VIM (F, G).

The two vertical expanders for the two VIMs are also similar. However, the vertical expanders are differently controlled. When functioning as 2:1 multiplexers, the vertical expander for VIM F (vXpF) is controlled by CLE select signal cleSel, while the vertical expander for VIM G (vXpG) is controlled by the AND function (provided by AND gate 202) of cleSel and VIM G data input signal g6. This difference is provided to allow the two VIMs in the slice to function as a single efficient unit, while also enabling the passage of data along the vertical expander chain from VIM G to VIM F in another slice, in another CLE positioned above SLICE 200.

There is only one SOP expander per slice (sopXp), which is used to combine signals formed using the vertical expander chain. In one embodiment (not pictured), the SOP expander is not included. In other embodiments (not pictured), only the horizontal expanders or only the vertical expanders are included.

Each expander has at least two configurable functions ("expander modes"). In one embodiment, the expander mode is selected by values stored in configuration memory cells similar to those used to control other functions in the CLEs, IOBs, and programmable interconnect structure of the FPGA. The expander modes available to the expanders of the pictured embodiment are shown in Table 1. FIGS. 4A–4D provide exemplary embodiments of the four expander types shown in Table 1. The different expander modes for each type of expander are now explained in conjunction with Table 1 and FIGS. 4A–4D. Note that the terminology "cleSel•g6" means the cleSel signal ANDed with the g6 signal.

TABLE 1

| Type | Names | Expander Modes | Data Inputs | Select Input |
|---|---|---|---|---|
| Horizontal | hXpFA, hXpFB, hXpGA, hXpGB | 2:1 MUX | L5, datapathIn | sliceSel |
| | | 2-input AND | PAL AND, datapathIn | none |
| | | Get-On Feedthrough | L5 or PAL AND datapathIn | memory cell none |
| Vertical | vXpF, vXpG | 2:1 MUX | ABMux output, vXp chain in | vXpF: cleSel, vxpG: cleSel · g6 |
| | | 2-input OR | ABMux output, vXp chain in | none |
| | | Get-On Feedthrough | ABMux output vXp chain in | none none |
| AB | ABMuxF, ABMuxG | 2:1 MUX | hXpA output, hXpB output | ABMuxF: f5, ABMuxG: q5 |
| | | 2-input OR | hXpA output, hXpB output | none |
| SOP | sopXp | 2-input OR | vXpChainOut, sopChainIn | none |
| | | Get-On Feedthrough | vXpChainOut sopChainIn | none none |

FIG. 16A shows one embodiment of a horizontal expander (h-expander) hXp. In the pictured embodiment, two configuration memory cells 451, 452 control multiplexer 453 to provide the h-expander output signal datapathOut (e.g., datapathFAOut) from any of four MUX input signals representing the four expander modes. The various expanders can be implemented in many different ways, as will be apparent to one of ordinary skill in the art of circuit design. Preferably, for the h-expander the path from the datapathIn terminal to the datapathOut terminal is made as fast as possible within the constraints of the available area, because any additional delay on this path can occur many times along the horizontal expander chain. Next in the level of importance is the path from the PAL AND terminal to the datapathOut terminal. The speeds of other paths through the h-expander are preferably compromised to improve the speed of these two more critical paths.

When MUX select signals S1, S0 (from memory cells 451, 452, respectively) are both low (i.e., 0,0) the h-expander is in 2:1 MUX mode. MUX 453 provides the output of MUX 454. MUX 454 provides the multiplexed value of signals datapathIn (e.g., datapathFAIn) and signal L5 (e.g., L5A from VIM F). MUX 454 is controlled by signal sliceSel. When sliceSel is low, signal datapathIn is provided. When sliceSel is high, signal L5 is provided. 2:1 MUX mode is used, for example, in implementing large LUTs, multiplexers, RAMs, and some types of tristate buffers (TBufs).

When signals S1,S0 are 0,1, the h-expander is in 2-input AND mode. MUX 453 provides the AND function (provided by AND gate 455) of signals datapathIn and the PAL AND signal from the PAL logic PL (A0–A3). 2-Input AND mode is used, for example, in implementing large PAL structures and some types of TBufs.

When signals S1,S0 are 1,0, the h-expander is in Get-On mode, and MUX 453 provides either signal L5 or the PAL AND signal. The selection is made by MUX 456, which is controlled by signal S2 from memory cell 457. Get-On mode is used to "get onto" (i.e., to initiate) the horizontal expander chain.

When signals S1,S0 are 1,1, the h-expander is in Feedthrough mode, and MUX 453 provides signal datapathIn to the datapathOut terminal. In effect, the slice is bypassed by the h-expander chain. In some embodiments, Feedthrough mode can be used to combine non-adjacent slices into a VIM complex, by bypassing intervening slices.

In one embodiment, MUX 456 is omitted, and in Get-On mode MUX 453 always provides signal L5. In this alternative embodiment, Get-On mode cannot be used to place the PAL AND signal onto the datapath chain. To initiate a Pterm expander chain in this embodiment, the PAL AND signal is ANDed with a "1" using the 2-input AND mode. The "1" is provided either by placing a high value on the horizontal expander chain in a previous slice (i.e., a slice to the left of the present slice), or by attaching a pullup to the datapathIn terminal. Such a pullup can be either a programmable pullup (e.g., controlled by a configuration memory cell) or a weak pullup that is easily overcome by a low value placed on the horizontal expander chain.

FIG. 16B shows one embodiment of a vertical expander (v-expander) vXp. In the pictured embodiment, two configuration memory cells 461, 462 control multiplexer 463 to provide the v-expander output signal from any of four MUX input signals representing the four expander modes.

When MUX select signals S1, S0 (from memory cells 461, 462, respectively) are both low (i.e., 0,0) the v-expander is in 2:1 MUX mode. MUX 463 provides the output of MUX 464. MUX 464 multiplexes between the AB expander output and the input to the vertical expander chain from below (e.g., vXpChainIn for v-expander vXpF). MUX 464 is controlled by signal cleSel (vXpF) or cleSel ANDed with VIM G data input signal g6 (vXpG). When the select signal for MUX 464 is low, MUX 464 provides the input to the vertical expander chain from below. When the select signal is high, MUX 464 provides the output signal from the AB expander ABMux. Note that when signal cleSel is low, the signal from below is passed on up the vertical expander chain; therefore, both v-expanders in the slice are bypassed. For both F and G v-expanders, the 2:1 MUX mode is used, for example, in implementing large LUTs, multiplexers, and RAMs.

When signals S1, S0 are 0,1, the v-expander is in 2-input OR mode. MUX 463 provides the OR function (provided by OR gate 465) of the AB expander output and the input to the vertical expander chain from below. This mode is used, for example, in implementing large PAL structures.

When signals S1, S0 are 1,0, the v-expander is in Get-On mode, and MUX 463 provides the AB expander output signal. Get-On mode is used to initiate the vertical expander chain.

When signals S1, S0 are 1,1, the v-expander is in Feedthrough mode, and MUX 463 passes the vertical expander chain input signal to the vertical expander chain output. Therefore, the VIM and associated logic (the half-slice) is bypassed by the v-expander chain. In some embodiments, Feedthrough mode can be used to combine vertically non-adjacent VIMs into a VIM complex, bypassing intervening VIMs. When both v-expanders (vXpF and vXpG) are in Feedthrough mode, signal vXpChainIn is passed on to signal vXpChainOut.

Figure 16C:
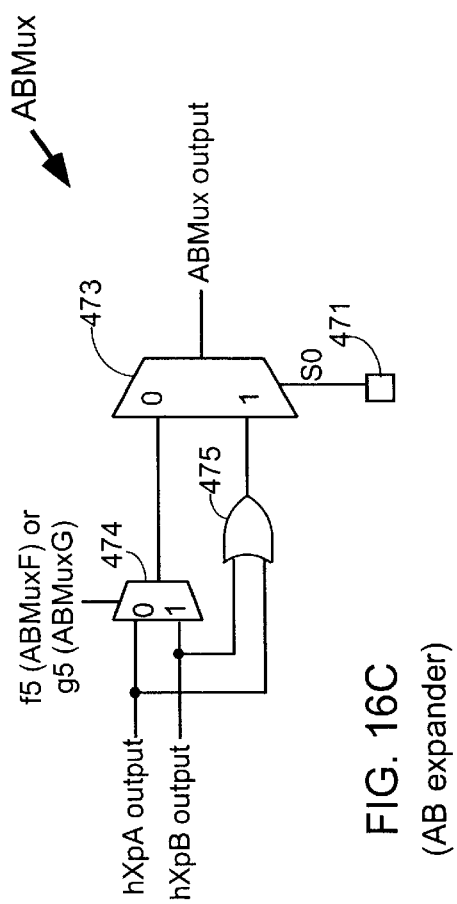
FIG. 16C shows one embodiment of an AB expander that can be used with the slice of FIG. 14.

FIG. 16C shows one embodiment of an AB expander ABMux. In the pictured embodiment, a configuration memory cell 471 controls multiplexer 473 to provide the AB expander output signal from either of two MUX input signals representing the two expander modes. When MUX select signal S0 from memory cell 471 is low (i.e., 0) the AB expander is in 2:1 MUX mode. MUX 473 provides the output of MUX 474, which multiplexes between the outputs of the two h-expanders (hXpA, hXpB) associated with the same VIM. For example, AB expander ABMuxG multiplexes between the outputs of h-expanders hXpGA and hxpGB. MUX 464 is controlled by the data input signal f5 or g5 of the associated VIM (VIM F or VIM G, respectively). For example, AB expander ABMuxG uses the g5 signal as the MUX select signal. This mode is used, for example, in combining the two 5-input LUT output signals L5A and L5B to create a 6-input LUT output signal. (The VIM is also in LUT6 mode, as was described in conjunction with FIG. 15.) This mode is also used in creating large LUTs, multiplexers, and RAMs.

When signal S0 is 1, the v-expander is in 2-input OR mode. MUX 473 provides the OR function (provided by OR gate 475) of the two h-expanders associated with the same VIM. This mode is used, for example, in implementing large PAL structures. In this embodiment, the AB expanders do not need a feedthrough mode, because the AB expander is easily bypassed, with the h-expander output signal being passed directly to the output multiplexers (see FIG. 14). Bypassing the AB expander generally results in a faster circuit implementation than passing the signal through the expander.

Figure 16D:
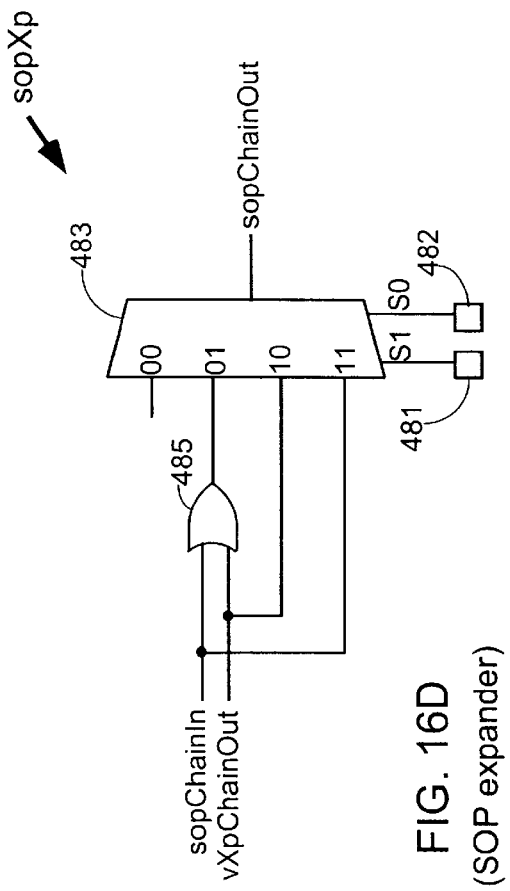
FIG. 16D shows one embodiment of a Sum-Of-Products expander that can be used with the slice of FIG. 14.

FIG. 16D shows one embodiment of a Sum-Of-Products expander (SOP expander) sopXp. In the pictured embodiment, two configuration memory cells 481, 482 control multiplexer 483 to provide the SOP expander output signal sopChainOut from any of three MUX input signals representing the three expander modes. In the pictured embodiment, MUX select signals S1, S0 (from memory cells 481, 482, respectively) are not both low at the same time. In other embodiments (not pictured), the SOP expanders also have a 2:1 MUX mode, similar to that of the h-expanders and v-expanders, that is selected when signals S1, S0 are both low.

When signals S1,S0 are 0,1, the SOP expander is in 2-input OR mode. MUX 483 provides the OR function (provided by OR gate 485) of the output of the v-expander vXpG (vXpChainOut) and the input to the SOP chain (sopChainIn). This mode is used, for example, in implementing large PAL structures.

When signals S1,S0 are 1,0, the SOP expander is in Get-On mode, and MUX 483 places the output of the v-expander vXpG (vXpChainOut) on the SOP chain. Get-On mode is used, for example, to initiate SOP chains for large PALs.

When signals S1,S0 are 1,1, the v-expander is in Feedthrough mode, and MUX 483 passes the SOP expander chain input signal (sopChainIn) to the SOP expander chain output (sopChainOut). Therefore, the slice is bypassed by the SOP expander chain. In some embodiments, Feedthrough mode can be used to combine non-adjacent slices into a VIM complex, by bypassing intervening slices.

VIM Complexes

The expander modes provided by the configured functions of the h-expanders and the v-expanders, together with the selected expansion mode of the CLE, determine the size of the VIM complex that will be used to implement a user function. For example, in combining horizontally adjacent slices, a user can choose to combine one, two, three, four, or more slices to form a VIM complex.

To create a VIM complex including two or more horizontally positioned slices, the slice on the left edge of the complex is used to initiate the horizontal expander chain. A horizontal expander chain can be initiated by setting the h-expander to Get-On mode and selecting either the L5 signal or the PAL AND signal to be placed on the horizontal expander chain. Alternatively, a horizontal expander chain can be initiated by setting the h-expander to 2:1 MUX mode and setting the corresponding sliceSel signal high, to place the L5 output signal onto the datapathOut terminal of the slice. Which method to use to initiate the chain depends on the function to be implemented by the VIM complex. Exemplary functions are shown in FIGS. 7–35, and are described in conjunction with these figures.

Once the horizontal expander chain has been initiated, the h-expanders of the remaining slices in the VIM complex can be set to 2:1 MUX mode or 2-input AND mode, depending on the function to be implemented by the VIM complex. If the horizontal expander chain is to bypass a slice (i.e., if one or both of the VIMs in the slice are to be omitted from the VIM complex), the h-expander is set to Feedthrough mode.

The horizontal expander chain can be accessed simply by "extracting" the chain output through either the AB expander ABMux and the output multiplexer oMux, or via the carry multiplexer cyMux (see FIG. 14). Alternatively or additionally, to create larger or more complex functions, the horizontal expander chain values can be combined using the vertical expander chain. For example, the output from the h-expander hXp can be routed through the AB expander ABMux to the v-expander vXp. Thus, if the horizontal expander chain forms a "first level" of complexity for implementing user functions, the vertical expander chain can optionally be used to form a "second level" of complexity that builds on the "first level" logic implemented by the horizontal chains.

To create a VIM complex including more than one vertically positioned VIM, the v-expanders are used. First, note that each slice includes two VIMs and two horizontal expander chains. The two horizontal expander chains in a slice can be used independently or they can be combined, for example, by setting the vXpF v-expander to Get-On mode and the vXpG v-expander to 2:1 MUX mode or 2-input OR mode. The vertical expander chain can be accessed at this point, or can be extended into a slice located above slice 200 in an adjacent CLE, or both. When the horizontal expander chain is not in use, the vertical expanders can still be used, by deriving the output of the AB expander ABMux from the VIM L5 output or the PAL AND logic, then placing the output of the AB expander ABMux onto the vertical expander chain.

A v-expander chain can be initiated by setting the v-expander to Get-On mode, as described in the previous example. Alternatively, a v-expander chain can be initiated in VIM F by setting v-expander vXpF to 2:1 MUX mode and setting the cleSel signal high, to place the ABMuxF output signal onto the output terminal of the vXpF expander. Similarly, a v-expander chain can be initiated in VIM G by setting v-expander vXpG to 2:1 MUX mode and setting the cleSel and g6 signals high, to place the ABMuxG output signal onto the vXpChainOut terminal of the slice. As a third alternative, a vertical expander chain can be initiated by setting the v-expander to 2-input OR mode and providing a "0" (low) signal to the input signal of the chain (as shown, for example, in FIG. 19). Which method to use to initiate the chain depends on the function to be implemented by the VIM complex. Exemplary functions are shown in FIGS. 19–22, and are described in conjunction with these figures.

Once the vertical expander chain has been initiated, the remaining v-expanders in the VIM complex can be set to 2:1 MUX mode or 2-input OR mode, depending on the function to be implemented by the VIM complex. If the vertical expander chain is to bypass a VIM, the associated v-expander is set to Feedthrough mode.

The vertical expander chain can be accessed simply by "extracting" the chain output through the output multiplexer oMux (see FIG. 14). Alternatively or additionally, the vertical expander chain output can be included in the horizontal Sum-of-Products (SOP) chain using the SOP expander, to create even larger and/or more complex functions. Thus, the SOP expander chain forms an optional "third level" of complexity for implementing user functions that builds on the "second level" logic implemented by the vertical expander chains. Alternatively, the SOP expander chain can be used as a "second level" of complexity building on the "first level" logic of the vertical chains, if the horizontal expander chains are not in use.

The SOP expanders provide a second method of creating a VIM complex that spans multiple horizontally-positioned slices. The SOP expanders are primarily used for combining two or more vertical expander chains. However, if the vertical expander chain in a given slice is not in use, the SOP expander chain can still be used by setting the vXpG v-expander to Get-On mode, thus supplying the AB expander (ABMuxG) output to the SOP expander chain.

Figure 20:
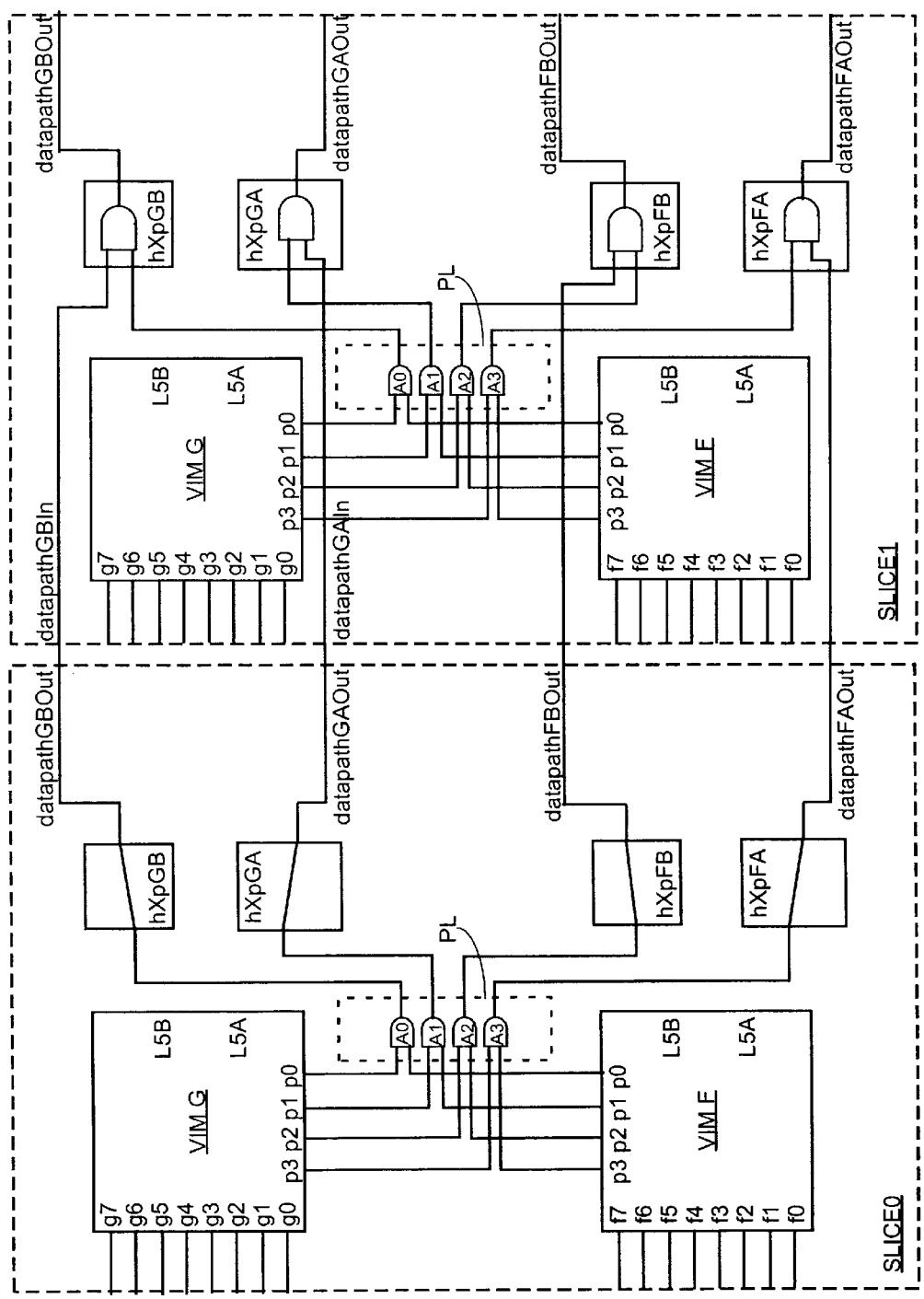

An SOP expander chain can be initiated by setting the SOP-expander sopXp to Get-On mode. Alternatively, an SOP expander chain can be initiated by setting the SOP expander sopXp to 2-input OR mode and supplying a "0" (low) signal to the sopChainIn terminal of the slice, as shown in FIG. 20.

Once the SOP expander chain has been initiated, the remaining SOP expanders in the VIM complex can be set to 2-input OR mode. If the SOP expander chain is to bypass an SOP expander, the SOP expander is set to Feedthrough mode.

The value on the SOP expander chain is available at the sopChainOut terminal of each slice.

Expansion Control Block

Figure 17:
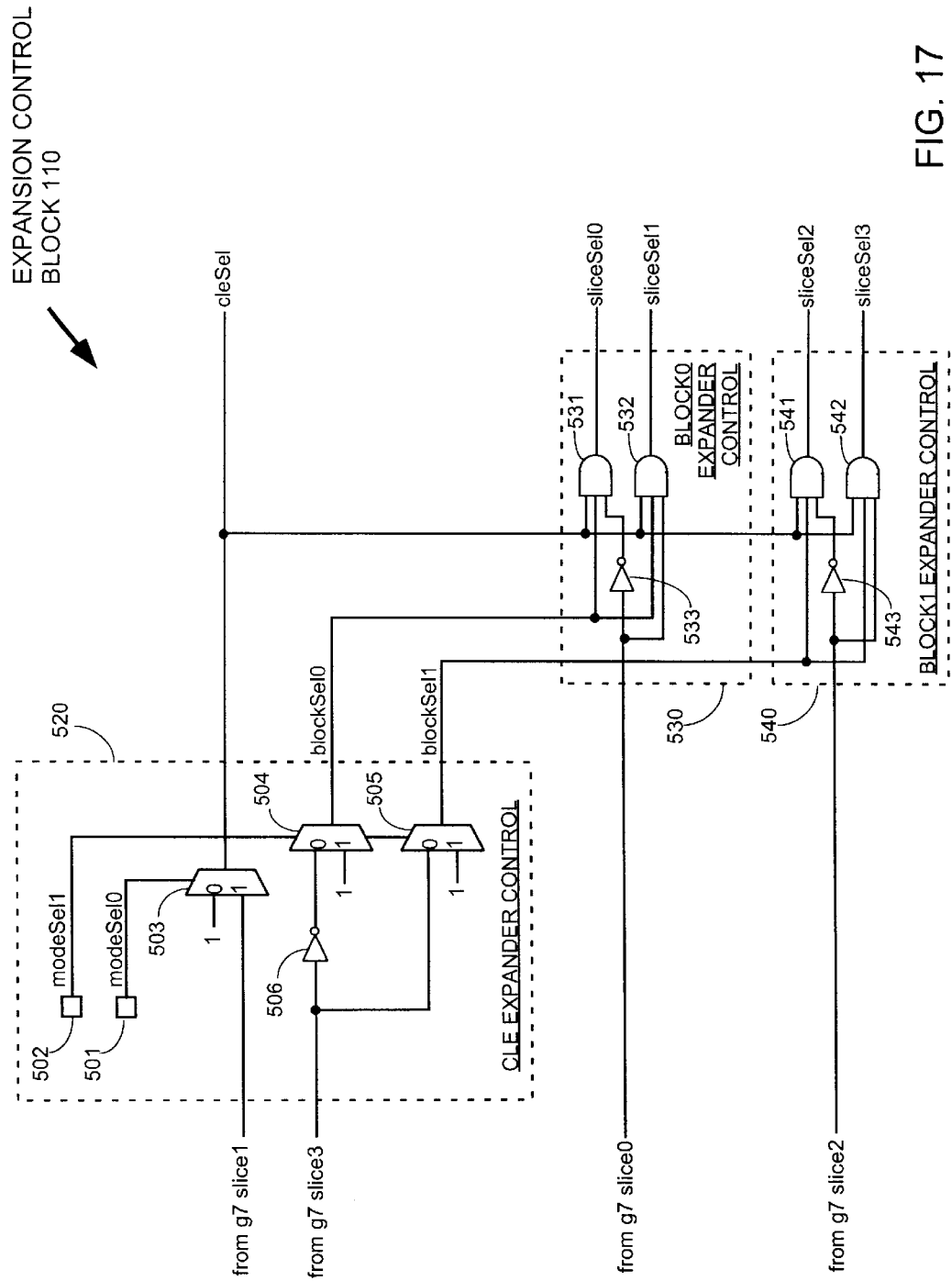
FIG. 17 shows an expansion control block that can be used with the slice of FIG. 14.
Figure 18:
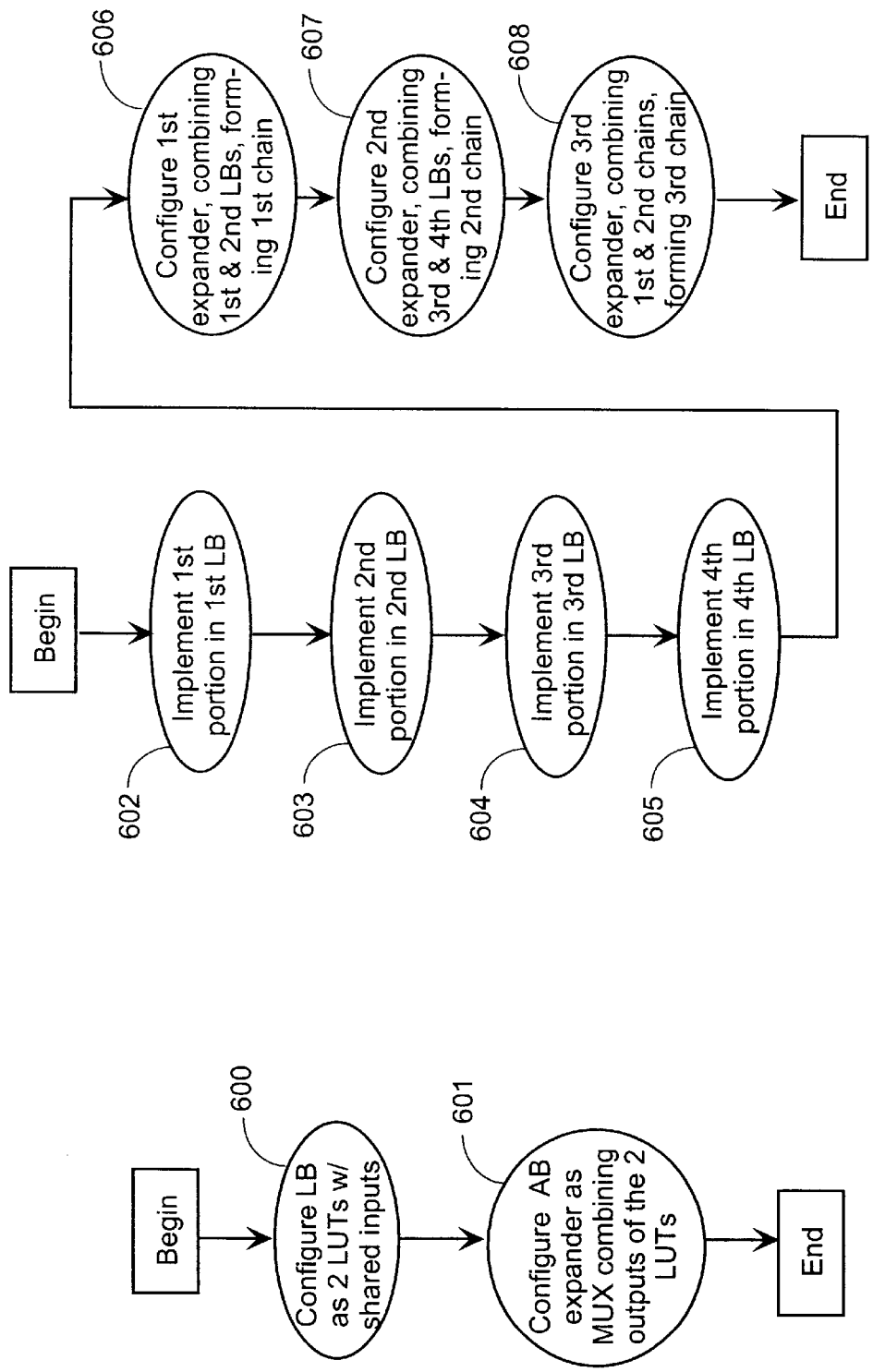
FIG. 18A is a flow diagram showing a method for implementing a user circuit in a PLD using (for example) the LUT of FIG. 15.
FIG. 18B is a flow diagram showing a method for implementing a user circuit in a PLD using expanders.

FIG. 17 shows one implementation of expansion control block 110. Expansion control block 110 generates the slice select signals that control the horizontal expanders when they are in 2:1 MUX mode, and also provides the CLE select signal that controls the vertical expanders when they are in 2:1 MUX mode. In the pictured embodiment, the various expanders are also controlled by data stored in configuration memory cells, and by signals supplied to the VIMs on the data input lines, e.g., f5, g5, g6, and g7.

In other embodiments of the invention, the expanders are controlled in other ways and by other sources. For example, in one embodiment (not shown), a CLE-wide control signal is provided that sets the horizontal, vertical, and SOP expanders to Feedthrough mode. (In one embodiment, this function is implemented by forcing the select signals of multiplexers 453, 463, and 483 high whenever the CLE-wide Feedthrough signal is high.) These and other variations on the inventive concept will become obvious to those of ordinary skill in the art on contemplation of the present description and figures. These variations fall within the scope and compass of the present invention.

Expansion control block 110 includes a CLE Expander Control portion 520, a Block 0 control portion 530, and a Block 1 control portion 540. CLE Expander Control portion 520 includes two configuration memory cells 501, 502 providing expansion mode control signals modeSel0 and modeSel1, respectively. Signal modeSel0 controls multiplexer 503, which provides a "1" (a high level) to signal cleSel when modeSel0 is low, and provides the signal on g7 of slice 1 to cleSel when modeSel0 is high. Signal modeSel1 controls multiplexer 504, which provides a "1" to signal blockSel0 when modeSel1 is high, and provides the signal on g7 of slice 3, inverted by inverter 506, to signal blockSel0 when modeSel1 is low. Multiplexer 505 provides a "1" to signal blockSel1 when modeSel1 is high, and provides the signal on g7 of slice 3 to signal blockSel1 when modeSel1 is low.

Block 0 control portion 530 includes AND gates 531, 532 and inverter 533. AND gate 531 provides slice select signal sliceSel0, and is driven by cleSel, blockSel0, and the signal on g7 of slice 0, inverted by inverter 533. AND gate 532 provides slice select signal sliceSel1, and is driven by cleSel, blockSel0, and the signal on g7 of slice 0. Note that signals sliceSel0 and sliceSel1 are not both high at the same time, because the signal on g7 of slice 0 cannot be both high and low at the same time.

Similarly, block 1 control portion 540 includes AND gates 541, 542 and inverter 543. AND gate 541 provides slice select signal sliceSel2, and is driven by cleSel, blockSel1, and the signal on g7 of slice 2, inverted by inverter 543. AND gate 542 provides slice select signal sliceSel3, and is driven by cleSel, blockSel1, and the signal on g7 of slice 2.

Expansion control block 110 can assume any of three different modes ("expansion modes"): Block mode, CLE mode, and Default mode. The expansion modes are only significant when the h-expanders are in 2:1 MUX mode, when the active expansion mode controls the behavior of the slice and CLE select signals. The active expansion mode is selected by the states of two mode control signals, modeSel0 and modeSel1, which in the pictured embodiments are controlled by values stored in two configuration memory cells. Table 2 shows the three different expansion modes, the corresponding states of the mode select signals, and the logic levels on the CLE, block, and slice control signals. Note that mode control signals modeSel0 and modeSel1 are not both high at the same time, as this is an unsupported configuration. The notation g7(3) means that the g7 signal of slice 3 is high, while the notation g7(3)' means that the g7 signal of slice 3 is low. The notation g7(1)•g7(3) represents the signal g7(1) ANDed with the signal g7(3).

TABLE 2

| Expansion Mode | mode-Sel0,1 | cle-Sel | block-Sel0,1 | sliceSel0,1, 2, 3 |
|---|---|---|---|---|
| Block | 0, 1 | 1 | 1, 1 | g7(0)', g7(0), g7(2)' g7(2) |
| CLE | 0, 0 | 1 | g7(3)', g7(3) | g7(3)' · g7(0)', g7(3)' · g7(0), g7(3) · g7(2)', g7(3) · g7(2) |
| Default | 1, 0 | g7(1) | g7(3)', g7(3) | g7(1) · g7(3)' · g7(0)', g7(1) · g7(3)' · g7(0), g7(1) · g7(3) · g7(2)', g7(1) · g7(3) · g7(2) |

Multiplexer Chains

One advantageous use of the h-expanders is to implement long multiplexer chains. Multiplexer chains are used, for example, to implement large lookup tables, multiplexers, tristate buffers, and RAMS. Because expanders in 2:1 MUX mode are controlled by a signal not provided to the VIM (e.g., a slice select signal), they provide an opportunity to insert an additional input, thereby implementing functions that cannot be implemented in a single VIM, but without using additional VIMs. Therefore, multiplexer chains are a powerful tool that can reduce the on-chip resources required to implement large user functions.

When a series of h-expanders are configured in 2:1 MUX mode, the number of slices contributing to the resulting VIM complex depends on which slices are selected to initiate the horizontal expander chains. For example, if every other slice initiates a new chain, VIM complexes of 2 slices (e.g., one block) are formed. If every fourth slice initiates a new chain, VIM complexes of 4 slices (e.g., one CLE) are formed. The three expansion modes (Block, CLE, and Default modes) of expansion control block 110 control which slices initiate new horizontal expander chains, by way of the slice select signals.

When the h-expanders are in 2:1 MUX mode, Block expansion mode results in both blocks in the CLE being selected to initiate a multiplexer chain. For example, using Block mode, two VIM complexes can be created in a single CLE, each comprising a single block, or two slices. As can be seen by the slice select signal values in Table 2, the g7 signal from the left-hand slice in each block (i.e., slices 0 and 2) selects between the two slices in the block. In other words, because the two slice select signals within each block always have opposite values, only one slice in the block initiates a horizontal expander chain. For example, when the g7 signal from slice 0 (denoted "g7(0)" in Table 2) is low, slice 0 is selected to initiate the chain (i.e., signal sliceSel0 is high), but slice 1 is not selected (i.e., signal sliceSel1 is low). If slice 2 is also selected to initiate a new horizontal expander chain (i.e., if g7(2) is low), slices 0 and 1 together form a single VIM complex.

As described, Block expansion mode can be used to create a VIM complex comprising the two slices in one block, e.g., to combine slices 0 and 1, and/or to combine slices 2 and 3. However, if the values on the g7 terminals are correctly selected, slices from different blocks can be combined. Therefore, the VIM complex can cross a block boundary.

When the h-expanders are in 2:1 MUX mode, the CLE expansion mode results in only one block in the CLE being selected to initiate a multiplexer chain, and only one slice in the selected block being selected. For example, using CLE mode, one VIM complex can be created from a single CLE (two blocks, or four slices). As can be seen by the slice select signal values in Table 2, the g7(3) signal selects between the two blocks in the CLE. For example, when g7(3) is low, either slice 0 or slice 1 is selected depending on the value of g7(0). When g7(3) is high, either slice 2 or slice 3 is selected depending on the value of g7(2). To use the entire CLE as a single VIM complex, slice 0 is selected to initiate the h-expander chain. Therefore, signals g7(3) and g7(0) are both low.

As described, CLE expansion mode can be used to create a VIM complex comprising slices 0–3 from a single CLE. However, if the values on the g7 terminals are correctly selected, slices from different CLEs can be combined. Therefore, the VIM complex can cross a CLE boundary.

When the h-expanders are in 2:1 MUX mode, the Default expansion mode results in either of two situations: 1) g7(1) is low, so no slices are selected to initiate the multiplexer chain; or 2) g7(1) is high, so the CLE reverts to CLE expansion mode and only one slice is selected to initiate the multiplexer chain. This mode can be used, for example, when the g7(1) input signal is required as an input to a complex function in a VIM complex larger than one CLE.

Implementing User Circuits

Clearly, the task of selecting and specifying the correct expansion mode for each CLE, the correct expander modes for each expander in each slice, and the correct values for the f5, g5, g6, and g7 data inputs for each VIM, can be time-consuming if manual methods are used. In one embodiment, FPGA implementation software (i.e., mapping and placement software) provided by the FPGA manufacturer selects and specifies these modes and values. In this embodiment, the presence of the expander capability is transparent to the user's schematics, HDL description, netlist, or other entry method.

In another embodiment, the FPGA manufacturer selects and specifies these modes and values for many common functions, e.g., PALs, lookup tables, multiplexers, tristate buffers, and memories of various sizes. The FPGA manufacturer then provides these functions to the user as a collection of library elements that can be added to the user's circuit either as HDL elements or schematic symbols. Preferably, the library elements can also be inferred by software that converts HDL (Hardware Design Language) circuit descriptions to netlists and/or FPGA configuration bitstreams.

FIG. 18A is a flow diagram showing a method for implementing a user circuit in a PLD using (for example) the logic block of FIG. 15. In the described example, the user circuit is a 6-input LUT. (In other embodiments, user circuits other than LUTs, or LUTs with other numbers of inputs, are implemented.) In step 600, the logic block (LB) is configured to be in 6-LUT mode. In other words, as described in conjunction with FIG. 15, the logic block provides two outputs of two 5-input LUTs with five shared inputs. In step 601, an AB expander driven by the outputs of the two 5-input LUTs is configured as a multiplexer (see FIG. 14, for example). The resulting multiplexer is controlled by a signal that forms the 6th input to the 6-LUT user circuit.

FIG. 18B is a flow diagram showing a method for implementing a user circuit in a PLD using expanders. In step 602, a first portion of the user circuit is implemented in a first logic block (LB). In steps 603–605 second, third, and fourth portions of the user circuit are implemented in second, third, and fourth portions of the user circuit, respectively. Steps 602–605 can be performed in any order. In step 606, a first expander is configured to combine the first and second logic blocks, forming a first expander chain extending in a first direction (e.g., horizontally). (Step 606 occurs after steps 602 and 603, but can occur prior to step 604 and/or step 605.) In step 607, a second expander is configured to combine the third and fourth logic blocks, forming a second expander chain extending parallel to the first expander chain. In step 608, a third expander is configured to combine the first and second expander chains, forming a third expander chain extending in a direction orthogonal to the first and second chains (e.g., vertically).

The remainder of the present specification describes exemplary implementations of various user circuits using the CLE of FIG. 13, the slice of FIG. 14, and the VIM of FIG. 15.

Implementing Large PALs

FIGS. 19–22 show how to implement exemplary PALs of various sizes. In each of these examples, the VIMs are configured in PAL mode. In another embodiment, the VIMs are replaced by logic blocks always operating as product term generators, with LUT functionality not being provided by the logic blocks. In another embodiment, the Pterms are always provided, regardless of the configured LUT mode of the VIM (e.g., both Pterm outputs and LUT outputs are provided in 5-LUT and 6-LUT modes). In some embodiments, other functionalities than PALs and LUTs are also supported.

Figure 19:
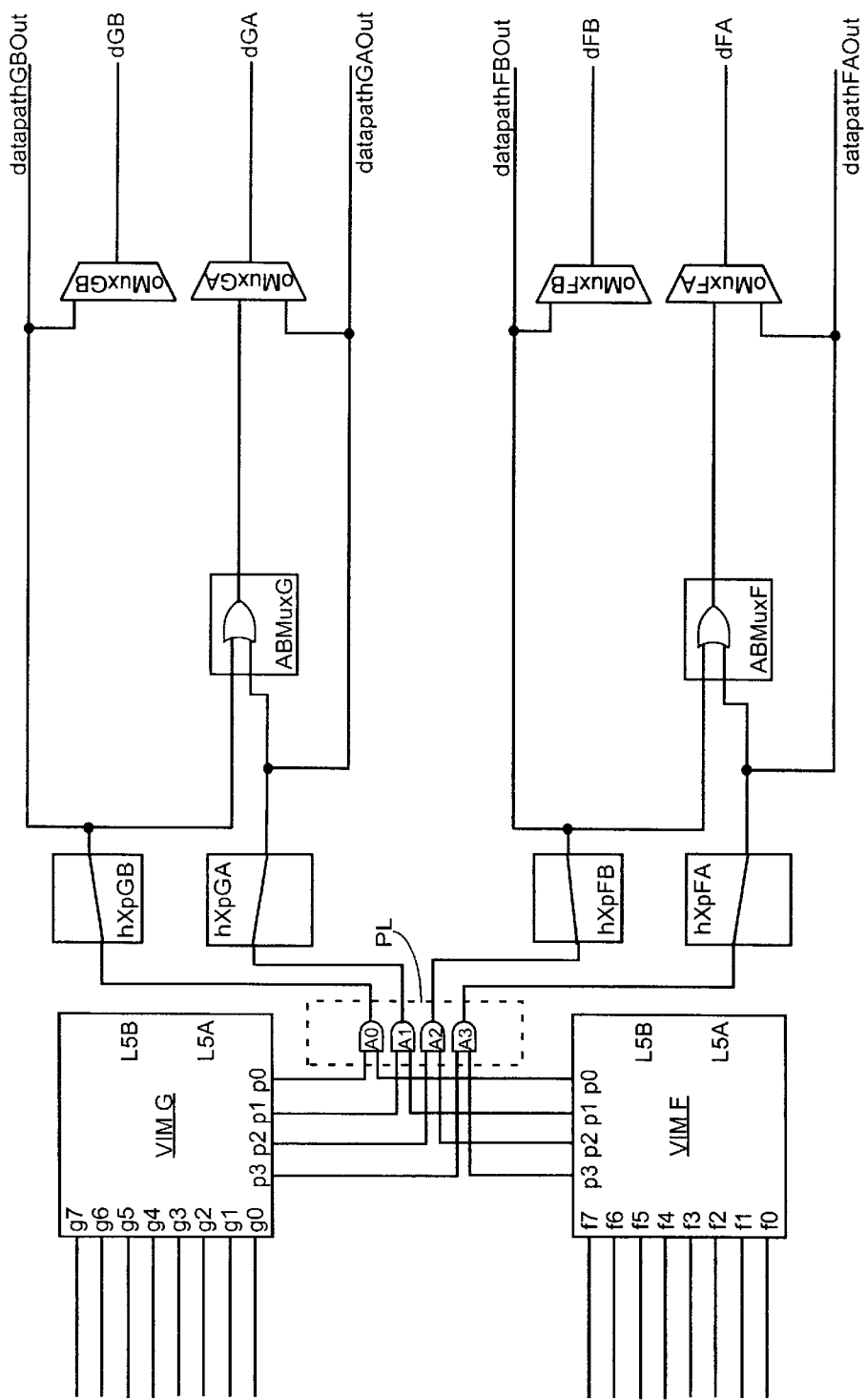
FIGS. 19–22 show how to implement exemplary PALS of various sizes using the CLE of FIG. 13 and the slice of FIG. 14.

FIG. 19 shows how the two VIMs of one slice can generate four output signals, each comprising one Pterm (i.e., product term) of 16 inputs. As shown in FIG. 19, the h-expanders hXp are placed in Get-On mode, with each one placing the associated PAL AND output onto the datapathOut terminal of the horizontal chain. The PAL AND output is available on either the datapathOut terminal or the data terminal "d" (via the output multiplexer oMux).

Alternatively, the 16-input Pterms can be combined in pairs within the slice using the AB expanders ABMuxF and ABMuxG in 2-input OR mode, thereby providing (again through the output multiplexers oMux) two PAL outputs of 2 Pterms with 16 inputs each.

FIG. 20 shows how horizontally adjacent VIMs (i.e., VIMs in two different slices) can be combined using expanders to generate four output signals, each comprising one Pterm of 32 inputs. This figure shows how to combine horizontally-positioned VIMs to increase the number of Pterm inputs, while the example of FIG. 19 shows how to combine two vertically-positioned VIMs in the same slice. In the example of FIG. 20, slice 0 and slice 1 of a single CLE are used. However, any two horizontally-positioned slices can be combined. They need not be in the same CLE, nor adjacent to each other.

In slice 0, the h-expanders are configured in Get-On mode, placing the PAL AND signal onto the horizontal expander chain. As in FIG. 19, each PAL AND output has 16 inputs. The output of the h-expander is then passed along the horizontal expander chain to slice 1, where the h-expander is configured in 2-input AND mode. Therefore, in slice 1, the PAL AND output from slice 0 is combined in an AND function with the PAL AND output from slice 1. Thus, the output of the h-expander in slice 1 is a 32-input Pterm. Of course, the 32-input Pterm can be placed on the "d" output terminal as in FIG. 19, as desired. Alternatively, the horizontal expander chain can be extended to yet another slice, as in FIG. 21, further increasing the number of inputs to the Pterms.

Figure 21:
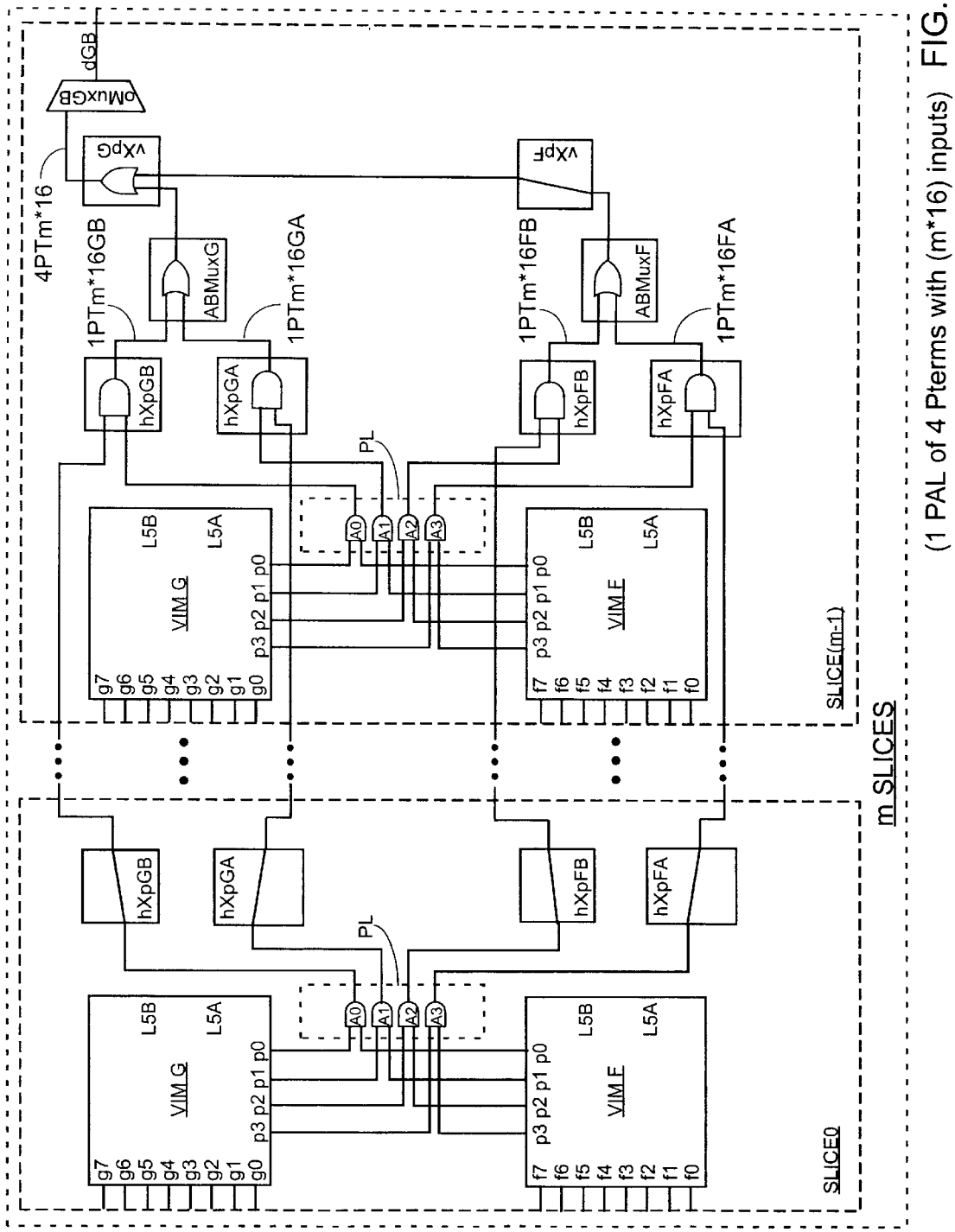

FIG. 21 shows how two or more slices can be combined using expanders to generate one OR'ed output signal (4PTm*16) comprising four Pterms of m*16 inputs (1PTm*16), where m is the number of slices. Slice 0 initiates the horizontal expander chain (as in FIGS. 7 and 8), while slices 1 through m−1 are each configured to add an additional 16 inputs to the PAL AND signal on the horizontal expander chain (as in slice 1 of FIG. 20). Each resulting Pterm (1PTm*16) has m*16 inputs. Slice m−1 is further configured to combine the two horizontal expander chains associated with each VIM, using the AB expanders (ABMuxF and ABMuxG) configured in 2-input OR mode.

Figure 22:
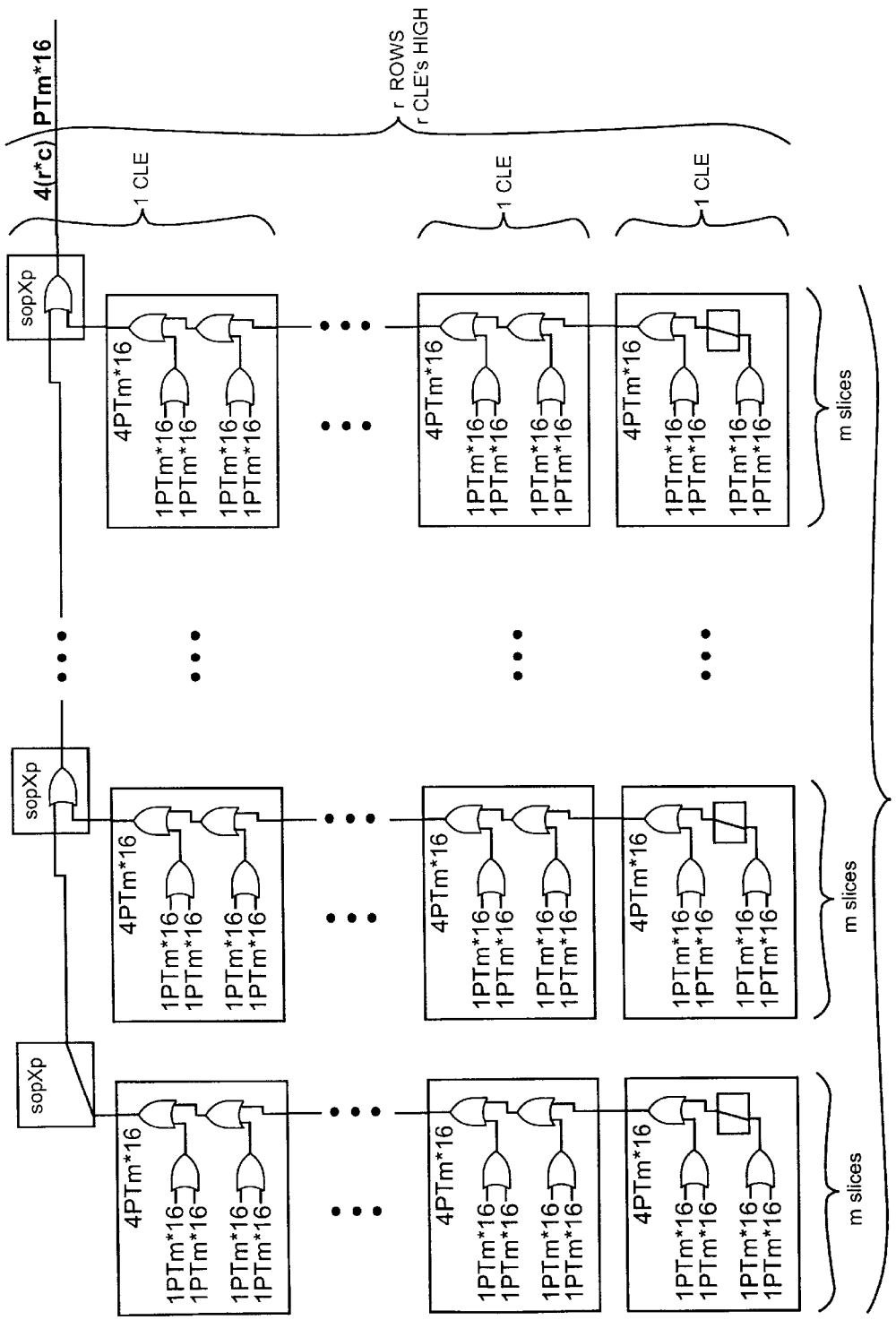

The outputs of the AB expanders are then combined (also in slice m−1) using the vertical expander chain (vXpF and vXpG). The v-expander vXpG is configured in 2-input OR mode. The v-expander vXpF is configured in Get-On mode. (To create wider PALs, the v-expander vXpF is configured in 2-input OR mode, thereby adding Pterms from the slice below, as shown in FIG. 22.) Thus, the resulting circuit is a series of Pterms combined using an OR function, creating a PAL output.

In the pictured example, the vertical expander chain is initiated in v-expander vXpF by placing the expander in Get-On mode. Alternatively, for example in an embodiment where Get-On mode is not available, the vertical expander chain can be initiated by ORing the output of AB expander ABMuxF with a "0" logic level (i.e., logic low) on the vXpChainIn terminal. In one embodiment, a weak pulldown transistor is provided to pull the vXpChainIn signal low when no other value is provided. In another embodiment, a pulldown transistor on the vXpChainIn line is controlled by a configuration memory cell.

As has been seen by the previous examples, the horizontal expander chain can be used to increase the number of inputs for a Pterm. The vertical expander chain can then be used to combine a large number of Pterms to generate a wide PAL output signal. As shown in FIG. 22, several vertically-positioned CLEs can be combined by using the configuration of FIG. 21, but extending the vertical expander chain across CLE boundaries. The vertical expander chain can be made as long as necessary to implement any size of PAL logic, by configuring the initiating v-expander in Get-On mode and the subsequent expanders in 2-input OR mode. (Of course, v-expanders can be skipped by placing them in Feedthrough mode.) However, an extremely long expander chain would be very slow. Therefore, for very wide functions, the CLE of FIG. 14 provides a second type of horizontal expander chain—the SOP chain—that can be used to combine the outputs of several vertical expander chains.

FIG. 22 shows how multiple VIMs can be combined using the SOP expanders to implement very large PALs, e.g., PALs with more than 8 Pterms of more than 16 inputs. The VIM complex of FIG. 22 is "r" CLEs high and "m" slices wide. The VIM complex includes "c" columns of "m" slices each, with each group of "m" horizontally adjacent slices being configured to implement (m*16)-input Pterms. These Pterm outputs are then combined using the vertical expanders as shown in FIG. 21. Each group of "m" horizontally-positioned slices thus provides a PAL output of four Pterms with m*16 inputs (4PTm*16). The outputs of the vertical expander chains (4PTm*16) are fed into the SOP expanders (sopXp). The initiating SOP expander is placed in Get-On mode, which places the output of the associated v-expander on the SOP expander chain. The subsequent SOP expanders are configured in 2-input OR mode. (Of course, SOP expanders and their associated CLEs can be omitted from the SOP expander chain by placing the SOP expanders in Feedthrough mode.) Thus, the number of combined Pterms is 4*r*c.

Note that the delay through the OR function using SOP expanders in an array of CLEs as shown in FIG. 22 is:

$$\text{horiz\_delay} + (\text{vert\_delay} * r) + (\text{SOP\_delay}) * c$$

where "horiz_delay" is the delay through one CLE on the horizontal expander chain, "vert_delay" is the delay through one CLE on the vertical expander chain, and "SOP_delay" is the delay through one CLE on the SOP expander chain.

For the same size PAL implemented without the SOP chain (i.e., using only the horizontal and vertical expander chains in a single column of r*c CLEs), the delay is:

$$\text{horiz\_delay} + (\text{vert\_delay} * r * c)$$

Therefore, for large PALs, the SOP expander chain provides a much faster implementation than would otherwise be available.

Conclusion

From the foregoing, it will be appreciated that higher performance implementations of combinational logic circuits may be realized by decomposing the combinational logic using the literal-sharing technique described above. The performance can be further increased by utilizing CLBs having second-level logic circuits. As described, second-level logic circuits may be fabricated within the CLB but external to the slices. Alternatively, combining gates may be fabricated within the slices. Even further performance gains can be achieved by providing a dedicated function generator to each slice. The dedicated function generator efficiently combines the outputs of first and second function generators.

The literal-sharing technique, the second-level logic circuits, and the dedicated function generator can be used alone, or in any combination, to realize higher performance implementations of combinational logic circuits on an FPGA.

Although several specific embodiments of the invention are described and illustrated above, the invention is not to be limited to the specific forms or arrangements of parts so described and illustrated. For example, the literal-sharing technique may be used to improve performance of combinational logic circuits implemented in any technology, and is not limited to FPGAs. Further, the second-level logic gates may perform any logic function, and are not limited to the sum function. The invention is limited only by the claims that follow.

We claim:

1. A logic block of an FPGA comprising:
   a plurality of lookup tables, each providing a lookup table output signal;
   a structure for programmably combining the lookup table output signals to generate a combined output signal; and
   a logic gate dedicated to generating a Boolean sum output signal from the combined output signal and a Boolean sum output signal from another logic block.

2. The logic block of claim 1 further comprising a multiplexer receiving a constant value and the cascade output signal from another logic block having the same structure, and controllable to provide to the logic gate one of (a) the constant value, and (b) the cascade output signal from another logic block having the same structure.

3. The logic block of claim 2 wherein the logic gate is an OR gate and the constant value is a logic 0.

4. The logic block of claim 2 wherein the logic gate is a NOR gate and the constant value is a logic 1.

5. The logic block of claim 1 wherein the structure for programmably combining the function generator output signals and generating a combined output signal comprises a function select multiplexer receiving as input signals the output of a NAND gate receiving input from the plurality of function generators and the output of a NOR gate receiving input from the plurality of function generators.

6. The logic block of claim 5 wherein the function select multiplexer further receives as an input signal an output of an output control multiplexer having as inputs the function generator output signals.

7. The logic block of claim 5 wherein the multiplexer can receive as an input signal a carry-out signal generated from a carry-in signal and the function generator output signals.

8. A configurable logic block comprising:
- a plurality of function generators including at least a first function generator and a second function generator, each function generator receiving a plurality of input signals and providing an output signal;
- a carry chain comprising a plurality of multiplexers each controlled by one of the function generators comprising at least a first multiplexer controlled by the first function generator and a second multiplexer controlled by the second function generator, each multiplexer receiving two input signals and providing an output signal, the output signal of the first multiplexer serving as one of the input signals of the second multiplexer, the second multiplexer providing as its output signal a carry chain output signal; and
- a sum-of-products gate providing a sum-of-products gate output signal and receiving as input signals the carry chain output signal and a sum-of-products gate output signal from another configurable logic block.

9. The configurable logic block of claim 8 further comprising a second configurable logic block of claim 8, wherein the sum-of-products gate output signal from another configurable logic block comes from the second configurable logic block.

10. The configurable logic block of claim 8 further comprising a second configurable logic block of claim 8, wherein the carry chain output signal from the second configurable logic block can provide one of the two input signals to the first multiplexer of the configurable logic block; and further comprising:
- a combined sum-of-products logic gate receiving the sum-of-products gate output signals from the configurable logic block and the second configurable logic block and providing a combined sum-of-products output signal.

11. A configurable logic block (CLB) for a programmable logic device (PLD) comprising:
- a first CLB slice having:
  - at least two first slice configurable function generators each receiving a plurality of input signals and generating an output signal;
  - a first structure for generating a first output signal from the output signals of the at least two first slice configurable function generators; and
  - a first combining gate for combining the first output signal with a first combining gate input signal to generate a first combining gate output signal;
- a second CLB slice having:
  - at least two second slice configurable function generators each receiving a plurality of input signals and generating an output signal;
  - a second structure for generating a second output signal from the output signals of the at least two second slice configurable function generators; and
  - a second combining gate generating a second slice output signal from the second output signal and the first combining gate output signal.

12. The CLB recited in claim 11 wherein the first combining gate is an OR gate.

13. A configurable logic block (CLB) for a programmable logic device (PLD) comprising:
- a first CLB slice having:
  - at least two configurable function generators each receiving a plurality of inputs and generating an output; and
  - a logic gate receiving the function generator outputs and from them generating a first output; and
  - a first combining gate for combining the first output with a combining gate input to generate a combining gate output,
- a second CLB slice comprising:
  - a configurable function generator receiving a plurality of inputs and generating a second output; and
  - a second combining gate for combining the second output with the combining gate output of the first CLB slice.

14. A configurable logic block (CLB) for a programmable logic device (PLD), the CLB comprising:
- a first CLB slice having:
  - a first configurable function generator generating a first output;
  - a second configurable function generator generating a second output;
  - a dedicated function generator for receiving the first output and the second output to generate a dedicated output, the dedicated function generator having a first logic gate and a second logic gate; and
  - a first combining gate for combining the dedicated output with a combining gate input to generate a first combining gate output; and
- a second CLB slice having:
  - a second combining gate connected to the first combining gate to have the first combining gate output serve as an input to the second combining gate.

15. The CLB recited in claim 14 wherein the dedicated function generator comprises:
- an AND gate receiving the first output and the second output to generate a product;
- an OR gate receiving the first output and the second output to generate a sum; and
- a multiplexer allowing selection between the product and the sum.

16. The CLB recited in claim 14 wherein the combining gate is an OR gate.

* * * * *